United States Patent
Toshiyoshi et al.

(10) Patent No.: US 11,081,977 B2
(45) Date of Patent: Aug. 3, 2021

(54) VIBRATIONAL ENERGY HARVESTER DEVICE

(71) Applicants: The University of Tokyo, Tokyo (JP); National University Corporation Shizuoka University, Shizuoka (JP); Saginomiya Seisakusho, Inc., Tokyo (JP)

(72) Inventors: Hiroshi Toshiyoshi, Tokyo (JP); Gen Hashiguchi, Hamamatsu (JP); Hiroyuki Mitsuya, Sayama (JP); Hiroshi Imamoto, Tokyo (JP)

(73) Assignees: The University of Tokyo, Tokyo (JP); National University Corporation Shizuoka University, Shizuoka (JP); Saginomiya Seisakusho, Inc., Tokyo (JP)

( * ) Notice: Subject to any disclaimer, the term of this patent is extended or adjusted under 35 U.S.C. 154(b) by 183 days.

(21) Appl. No.: 16/464,620

(22) PCT Filed: Nov. 16, 2017

(86) PCT No.: PCT/JP2017/041175
§ 371 (c)(1),
(2) Date: May 28, 2019

(87) PCT Pub. No.: WO2018/101047
PCT Pub. Date: Jun. 7, 2018

(65) Prior Publication Data
US 2021/0099104 A1 Apr. 1, 2021

(30) Foreign Application Priority Data
Nov. 29, 2016 (JP) .............................. JP2016-231751

(51) Int. Cl.
H02N 1/00 (2006.01)
H02N 1/08 (2006.01)

(52) U.S. Cl.
CPC .................................... H02N 1/08 (2013.01)

(58) Field of Classification Search
CPC .................................. H02N 1/00; H02N 1/08
See application file for complete search history.

(56) References Cited

U.S. PATENT DOCUMENTS 2,247,783 A * 7/1941 Massolle ................. H02M 7/54
  361/289
5,780,948 A * 7/1998 Lee ........................ F16F 7/1011
  310/81

(Continued)

FOREIGN PATENT DOCUMENTS

JP 2002-244806 A 8/2002
JP 2011-36089 A 2/2011

(Continued)

OTHER PUBLICATIONS

International Search Report (PCT/ISA/210) issued in PCT Application No. PCT/JP2017/041175 dated Jan. 23, 2018 with partial English translation (four (4) pages).

(Continued)

Primary Examiner — Burton S Mullins
(74) Attorney, Agent, or Firm — Crowell & Moring LLP

(57) ABSTRACT

Provided is an electrostatic-type vibrational energy harvester device that makes it possible to efficiently rectify and charge power from low acceleration to high acceleration of vibrational energy applied from the exterior. The vibrational energy harvester device is provided with: a movable part capable of vibrating in a vibration direction as a result of mechanical vibrational energy, said movable part being provided with a first surface along the vibration direction; and a fixed part provided with a second surface facing the (Continued)

first surface of the movable part with a gap therebetween so that it is possible for the movable part to vibrate in the vibration direction. A plurality of recessed portions and protruding sections are formed in an alternating manner in the vibration direction on the surfaces of each of the first surface of the movable part and the second surface of the fixed part. An electret film is formed on at least one of the fixed part and the movable part. The vibrational energy harvester device is configured so that a force factor (electromechanical conversion factor) having a value that corresponds to the gap between the first surface of the movable part and the second surface of the fixed part becomes small when the vibration amplitude of the movable part is small and large when the vibration amplitude of the movable part is large.

15 Claims, 15 Drawing Sheets

(56) References Cited

U.S. PATENT DOCUMENTS

| | | | | |
|---|---|---|---|---|
| 7,062,970 B2 * | 6/2006 | Higuchi | ............ | G01C 19/5719 |
| | | | | 331/154 |
| 7,649,302 B2 * | 1/2010 | Murayama | ............ | H02N 1/004 |
| | | | | 310/309 |
| 7,851,968 B2 * | 12/2010 | Chaillout | ................ | H02N 1/08 |
| | | | | 310/309 |
| 8,710,712 B2 * | 4/2014 | Nakatsuka | ............... | H02N 1/00 |
| | | | | 310/309 |
| 8,716,916 B2 * | 5/2014 | Nakatsuka | ............. | H02N 1/004 |
| | | | | 310/309 |
| 9,837,933 B2 * | 12/2017 | Park | ......................... | H02N 1/04 |
| 10,666,166 B2 * | 5/2020 | Goda | ....................... | H02N 1/08 |
| 2011/0219892 A1 | 9/2011 | Fukushima et al. | | |
| 2013/0076202 A1 | 3/2013 | Naito et al. | | |
| 2013/0134830 A1 | 5/2013 | Ikuta et al. | | |
| 2013/0241346 A1 * | 9/2013 | Boisseau | ................. | H02N 1/08 |
| | | | | 310/300 |
| 2018/0041140 A1 | 2/2018 | Fujita et al. | | |

FOREIGN PATENT DOCUMENTS

| | | |
|---|---|---|
| JP | 2011-186803 A | 9/2011 |
| JP | 2013-13256 A | 1/2013 |
| WO | WO 2011/086830 A1 | 7/2011 |
| WO | WO 2012/008113 A1 | 1/2012 |
| WO | WO 2012/073465 A1 | 6/2012 |
| WO | WO 2012/169196 A1 | 12/2012 |
| WO | WO 2016/129597 A1 | 8/2016 |

OTHER PUBLICATIONS

Japanese-language Written Opinion (PCT/ISA/237) issued in PCT Application No. PCT/JP2017/041175 dated Jan. 23, 2018 (five (5) pages).

Misawa K. et al., "Reliability of potassium ion electret in silicon oxide for vibrational energy harvester applications", Japanese Journal of Applied Physics, 2015, pp. 067201-1-067201-5, vol. 54, (five (5) pages).

* cited by examiner

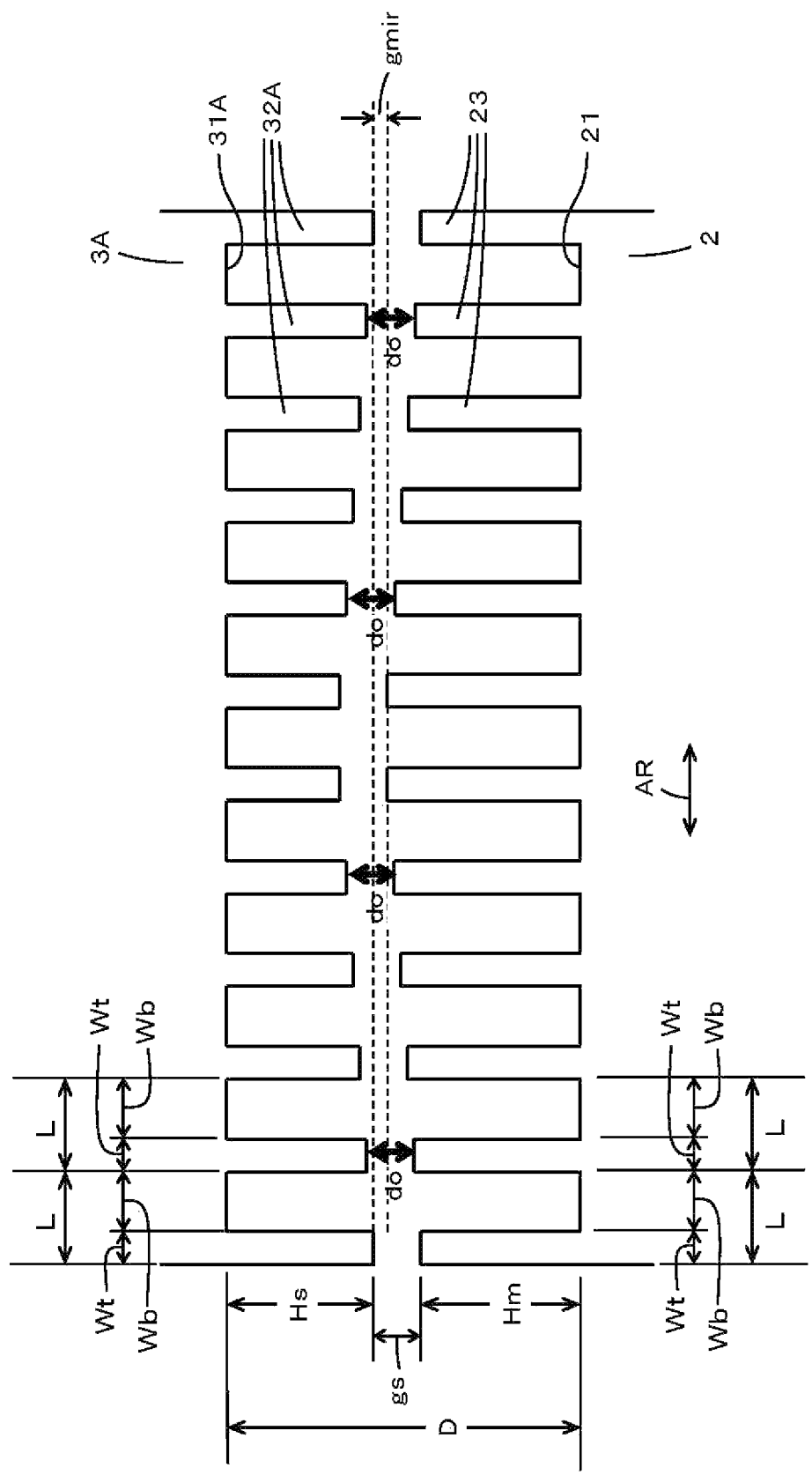

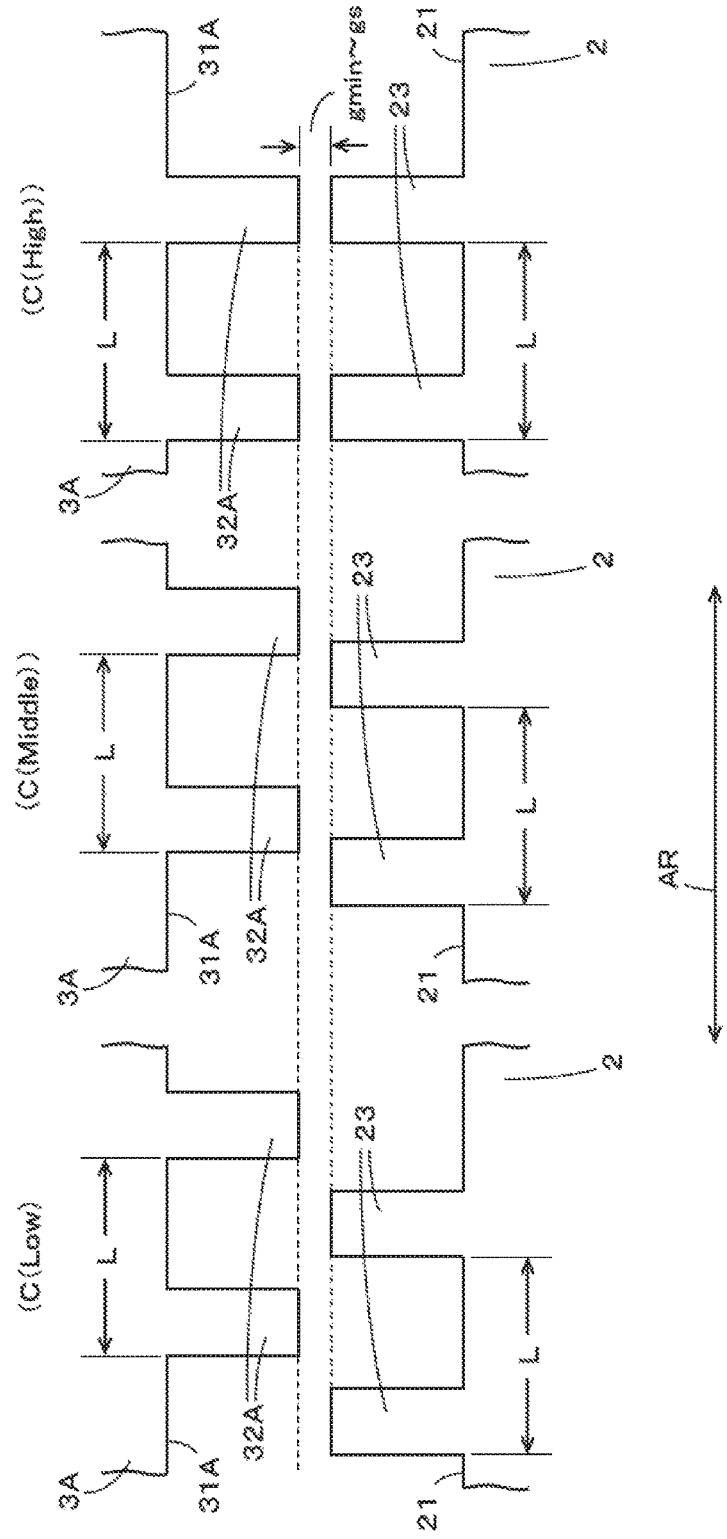

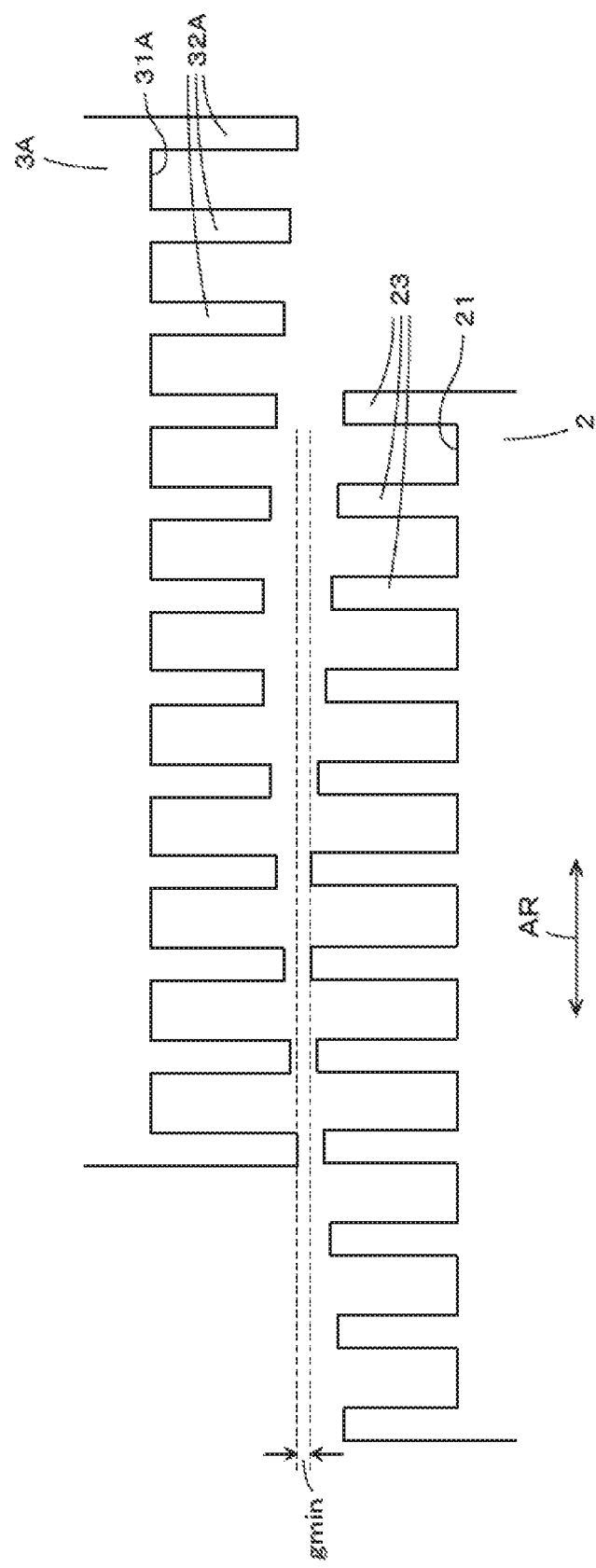

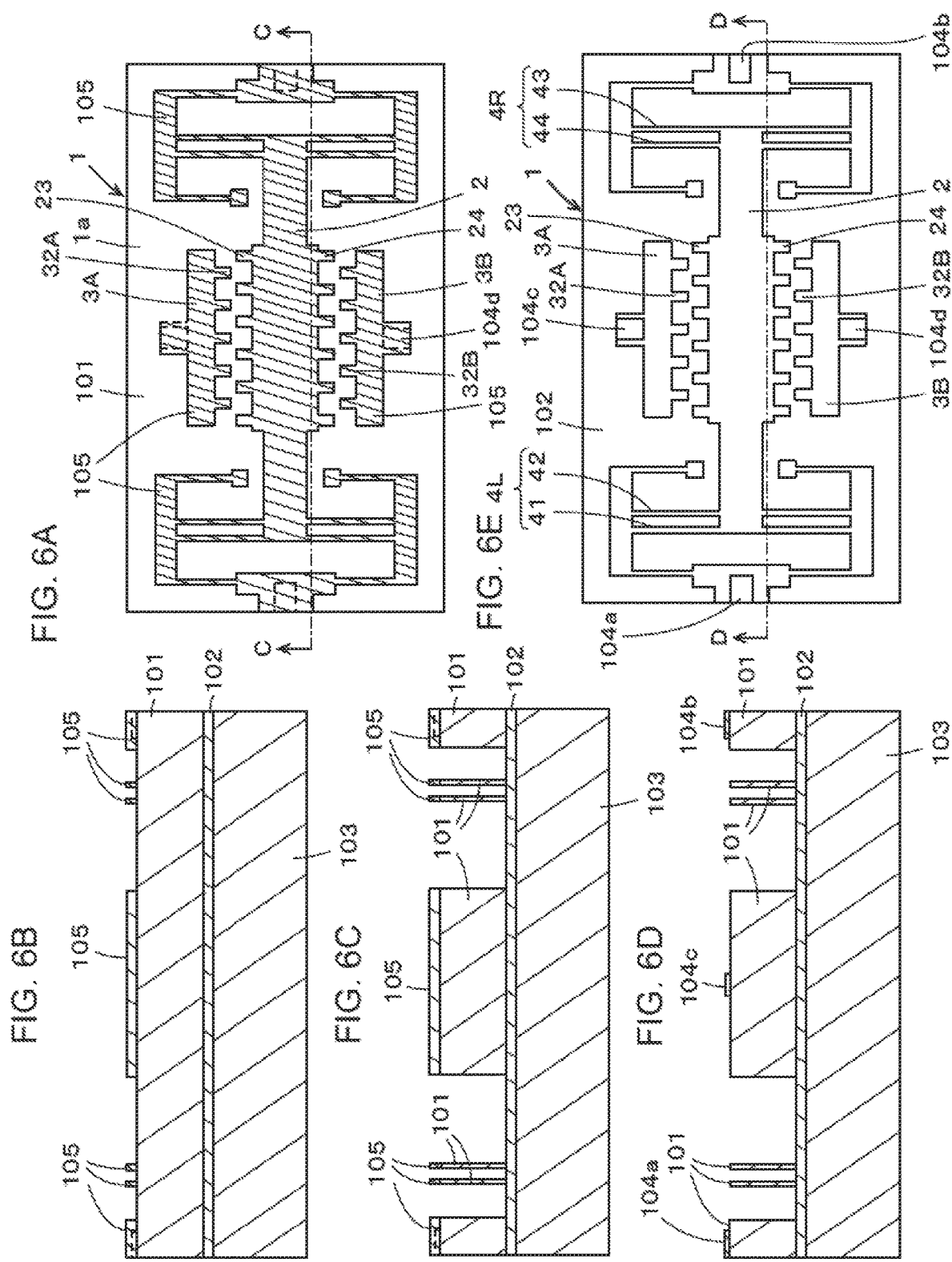

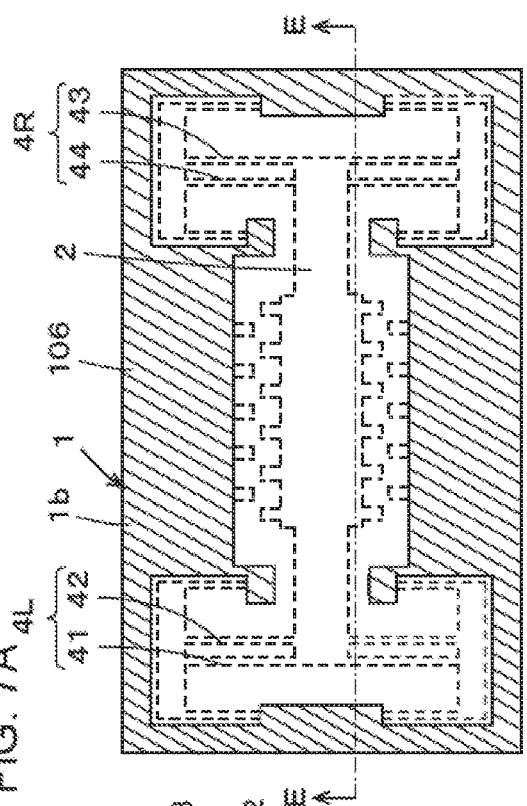
FIG. 7A
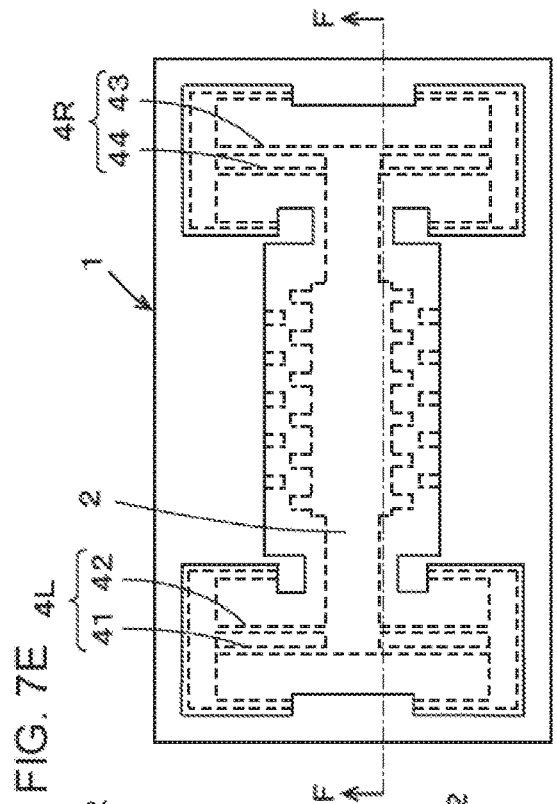
FIG. 7E
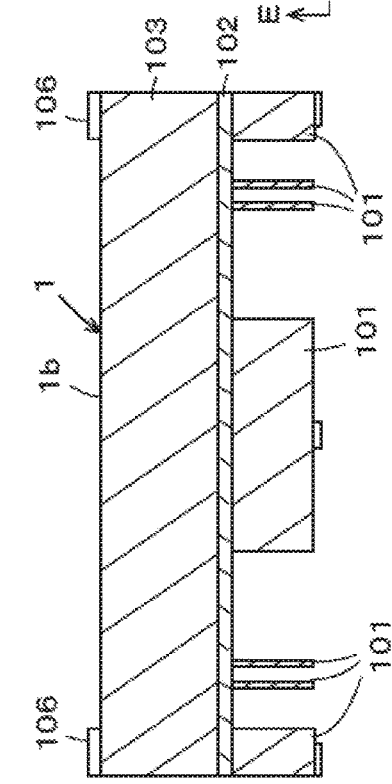
FIG. 7B
FIG. 7C
FIG. 7D
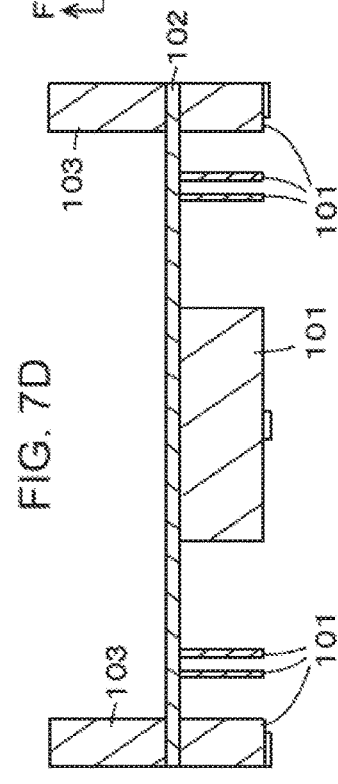

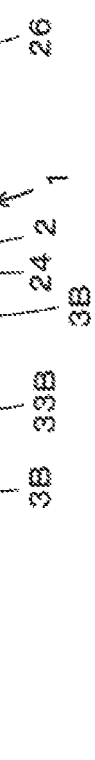
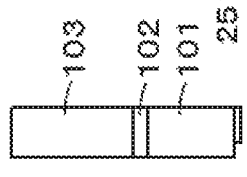
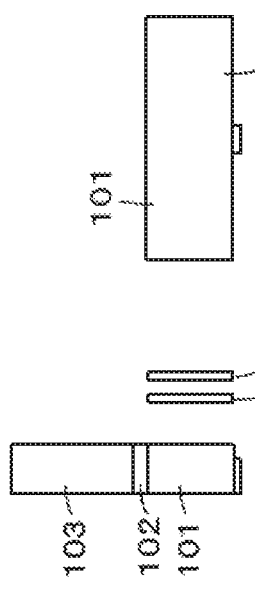
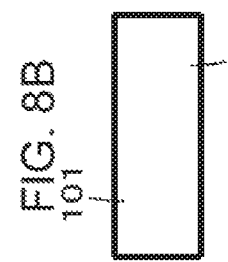
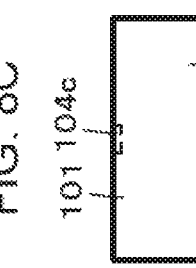
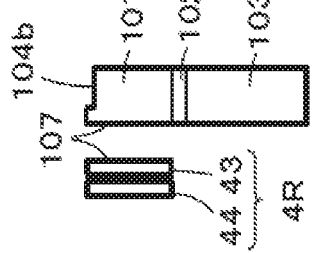
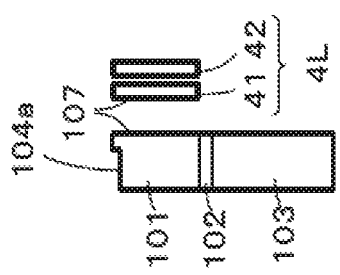

FIG. 19

$$\begin{bmatrix} f \\ i \end{bmatrix} = \begin{bmatrix} Zm & -A \\ A & J\omega(Co+Cs) \end{bmatrix} \begin{bmatrix} v \\ e \end{bmatrix}$$

$\cdots$ (Formula 1)

$$A = \frac{2n\varepsilon_0 bE}{do}$$

$\cdots$ (Formula 2)

$$Zm = \frac{r}{A^2}$$

$\cdots$ (Formula 3)

$$i = \frac{Af}{Zm}$$

$\cdots$ (Formula 4)

$$e = \frac{f}{A}$$

$\cdots$ (Formula 5)

$$P = \frac{mx^2\omega^3 Q}{4}$$

$\cdots$ (Formula 6)

VIBRATIONAL ENERGY HARVESTER DEVICE

TECHNICAL FIELD OF THE INVENTION

Our invention relates to a vibrational energy harvester device of electrostatic type with an electret to convert mechanical vibrational energy into electricity by electrostatic induction action.

BACKGROUND ART OF THE INVENTION

Recent research and development are being conducted to put a vibrational energy harvester device to practical use of converting vibrational energy into electricity from environmental vibration such as walking vibration, vehicle travel vibration, bridge vibration, low-frequency vibration caused by wind power or the like.

Such a kind of vibrational energy harvester device of electrostatic type attracts rising attention for reasons that it is easily downsized relative to an electromagnet type and that it contains no harmful material such as PZT (Lead Zirconate Titanate Oxide, PbZrTi) contained in a piezoelectric type. Such a kind of vibrational energy harvester device of electrostatic type is disclosed in Patent document 1 (WO2011/086830) and Patent document 2 (JP2011-36089-A).

Patent document 1 discloses an electrostatic induction type power generator capable of displacing relatively as keeping an opposing condition that a first substrate is opposed to a second substrate through a predetermined gap. The first substrate is provided with a plurality of strip-shaped electrets disposed along a direction of the relative displacement while the second substrate is provided with a first electrode and a second electrode opposing to the second electret, so that the relative displacement changes a first capacitance between the electret and the first electrode as well as a second capacitance between the electret and the second electrode to output electricity.

Patent document 2 discloses a device of MEMS (Microelectromechanical Systems) provided with a first electrode having an electret film formed on a substrate and a second electrode which has a plurality of openings and is opposed to the first electrode through an air gap so that the capacitance between the electret film and the second electrode is changed to output electricity by vibrationally shifting the second electrode.

PRIOR ART DOCUMENTS

Patent Documents

Patent document 1: JP2011-186803-A
Patent document 2: JP2002-244806-A

SUMMARY OF THE INVENTION

Problems to be Solved by the Invention

When vibrational energy such as the environmental vibration is applied externally to the vibrational energy harvester device, the excitation vibration acceleration is not constant but changes temporarily. Force f of vibrational energy applied to the vibrational energy harvester device satisfies the formula $f=m\alpha$, where symbol $\alpha$ indicates excitation vibration acceleration while symbol m indicates mass of vibration part of vibrational energy harvester device. Further, generated electric power P, electric current i and voltage V of the vibrational energy harvester device are proportional to force f.

Here, the vibrational energy harvester device rectifies electric current output to be charged in a charging element such as charging capacitor to output the generated electric power. Therefore, it is desirable that the vibrational energy harvester device generates electricity to efficiently be charged in the charging element from environmental vibration, regardless of excitation vibration acceleration value of small or great.

To charge with electric power output from the vibrational energy harvester device, output voltage of the electric power should be higher than threshold voltage of rectifier diode, such as Schottky diode having threshold voltage of 0.3V and silicon-based P-N junction diode having threshold voltage of 0.7V.

However, conventional vibrational energy harvester device has a fixed value of output impedance generally. Therefore, when the output impedance of vibrational energy harvester device is increased to make the rectifying diode conductive with even small output electric current at a low excitation vibration acceleration, great electric current cannot be utilized efficiently to increase the loss in spite of great value of output electric current at a high excitation vibration acceleration. On the other hand, when the output impedance of vibrational energy harvester device is decreased to efficiently utilize the great electric current at a high excitation vibration acceleration, the voltage higher than the threshold voltage of the rectifying diode cannot be achieved so that the vibrational energy at a low excitation vibration acceleration cannot be utilized for vibrational power generation performed by the vibrational energy harvester device.

Accordingly, it could be helpful to provide a vibrational energy harvester device of electrostatic type capable of rectifying and charging electricity efficiently from low to high acceleration even when the vibrational energy of environmental vibration having excitation vibration acceleration changing temporarily is applied externally.

Means for Solving the Problems

To solve the above-described problems, our invention provides, a vibrational energy harvester device capable of vibrating in a vibration direction by an externally supplied vibrational energy, comprising: a movable part having a first surface along the vibration direction; and a fixed part which has a second surface opposed through a gap to the first surface and is positionally fixed to allow the movable part to vibrate in the vibration direction, wherein the first surface of the movable part and the second surface of the fixed part are provided with a plurality of recessed portions and salients which are disposed alternately in the vibration direction, an electret film is formed on at least one of the fixed part and the movable part, and a force factor as an electromechanical conversion factor having a value corresponding to the gap between the first surface of the movable part and the second surface of the fixed part increases when a vibration amplitude of the movable part increases.

Ideally, our vibrational energy harvester device provided with the movable part and the fixed part has output of:

output impedance Zm calculated according to $Zm=r/A^2$;
output electric current i calculated according to $i=Af/Zm$;
and output voltage e calculated according to e=f/A, where symbol r indicates mechanical resistance (damping resistance) and symbol A indicates force factor (electromechanical conversion factor).

When the movable part has a small vibration amplitude at a low acceleration, output impedance Zm increases and output voltage e increases because of small force factor (electromechanical conversion factor) A, even if electric current i is small. Therefore the rectifying diode can be made conductive at a low acceleration so that small output electric current i is rectified efficiently to perform charging.

On the other hand, when the movable part has a great vibration amplitude at a high acceleration, output impedance Zm decreases and output current i increases because of great force factor (electromechanical conversion factor) A. Although output voltage e decreases, the rectifying diode can be made conductive because of great external force f. Accordingly, when the movable part has a great vibration amplitude, great electric current i according to the amount of external force f can be rectified efficiently to perform charging.

Effect According to the Invention

Our invention provides a vibrational energy harvester device of electrostatic type capable of efficiently rectifying and charging electricity regardless of low or high acceleration. Accordingly, our vibrational energy harvester device is desirably used when the vibrational energy of environmental vibration having excitation vibration acceleration changing temporarily is applied externally.

BRIEF EXPLANATION OF THE DRAWINGS

FIG. 2 is an explanation view showing a main part of the example of the first configuration of our vibrational energy harvester device.

FIGS. 3A to 3C are explanation views showing a main part of the example of the first configuration of our vibrational energy harvester device.

FIG. 4 is yet another explanation view showing a main part of the example of the first configuration of our vibrational energy harvester device.

FIGS. 6A to 6E are explanation views showing the process for manufacturing a semiconductor according to the first configuration of our vibrational energy harvester device.

FIGS. 7A to 7E are explanation views showing the process for manufacturing a semiconductor according to the first configuration of our vibrational energy harvester device.

FIGS. 8A to 8D are explanation views showing the process for manufacturing a semiconductor according to the first configuration of our vibrational energy harvester device.

FIG. 19 shows formulae showing a model of our vibrational energy harvester device.

EMBODIMENTS FOR CARRYING OUT THE INVENTION

Hereinafter, examples of our vibrational energy harvester device will be explained with reference to the figures.

First Configuration

An embodiment of the first configuration of our vibrational energy harvester device will be explained. The following first configuration of vibrational energy harvester device is an example of MEMS device manufactured by a semiconductor manufacturing process.

Figure 1:
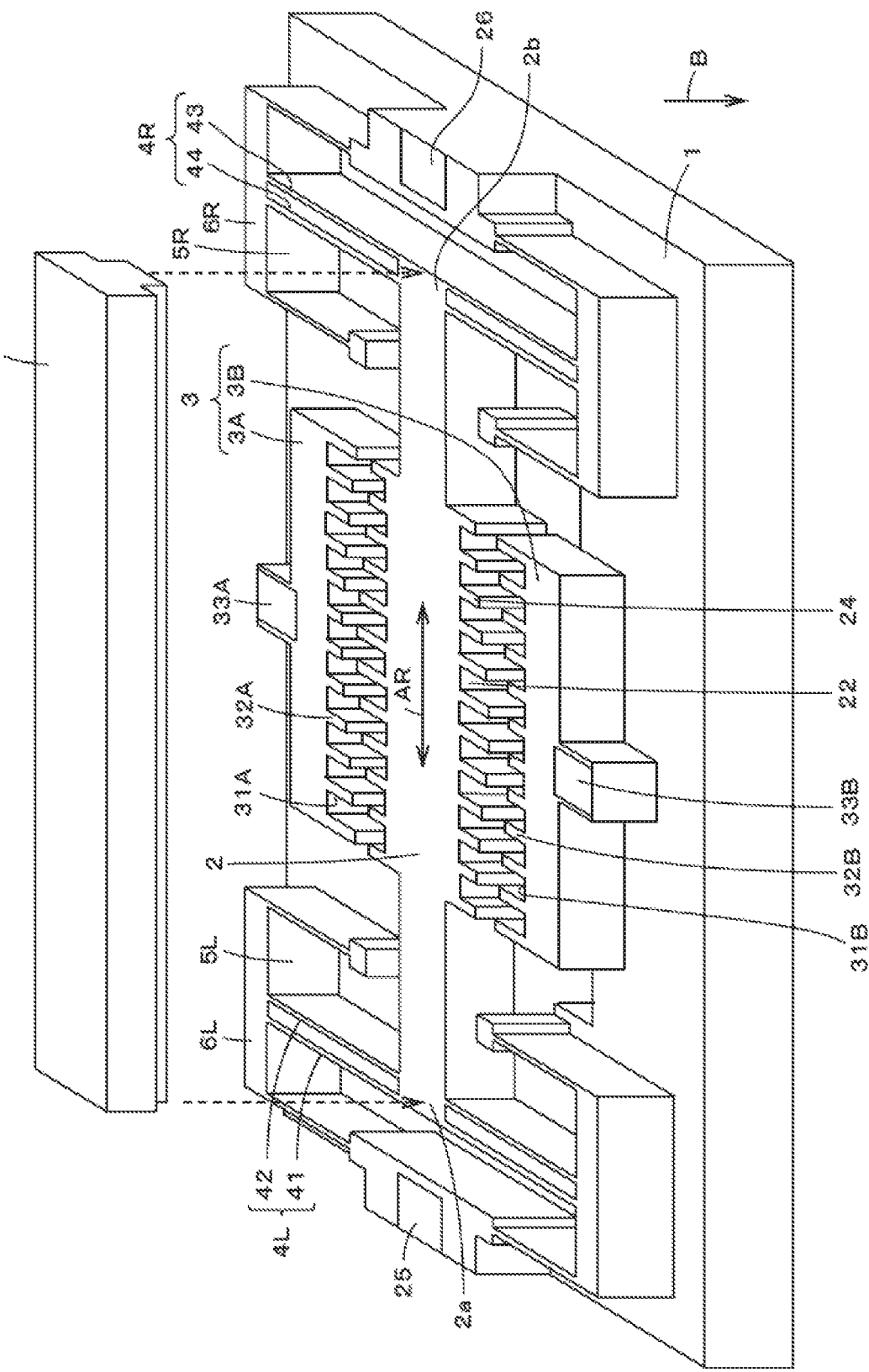
FIG. 1 is a perspective view for explaining an example of the first configuration of our vibrational energy harvester device.
Figure 5A:
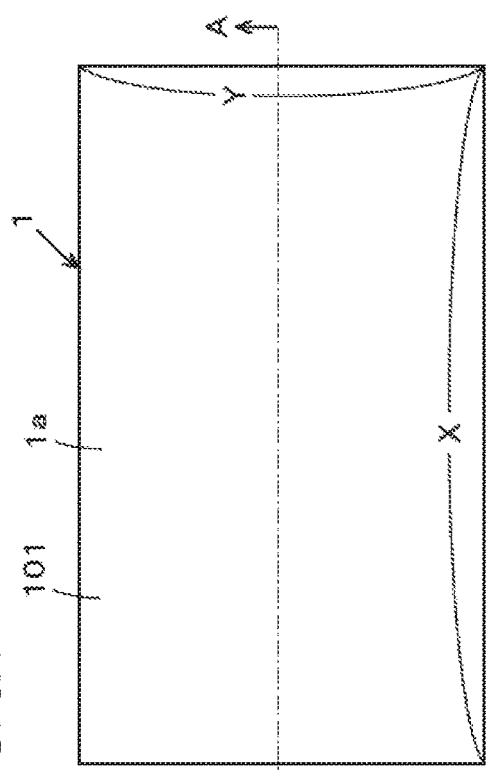
FIGS. 5A to 5E are explanation views showing a process for manufacturing a semiconductor according to the first configuration of our vibrational energy harvester device.
Figure 5B:
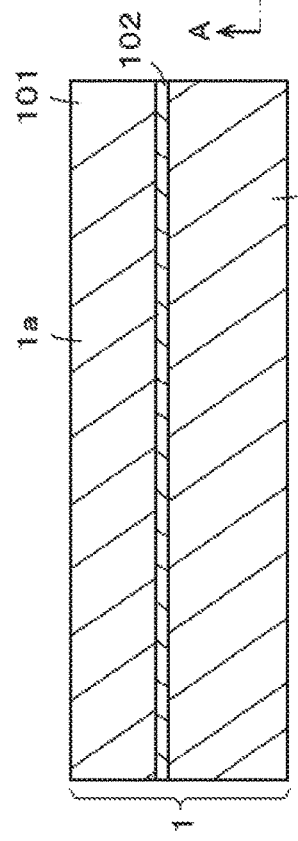
Figure 5C:
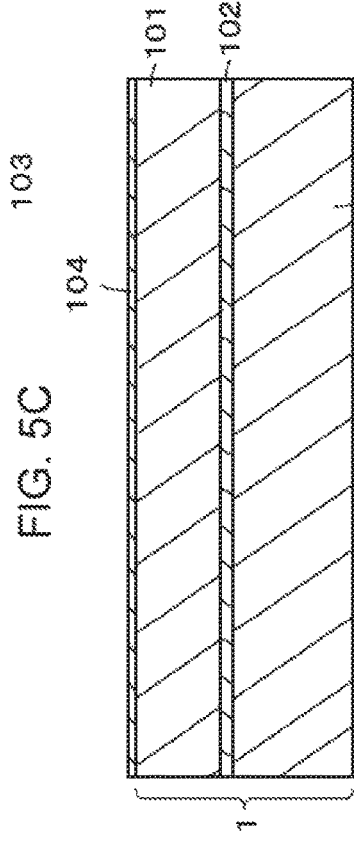
Figure 5E:
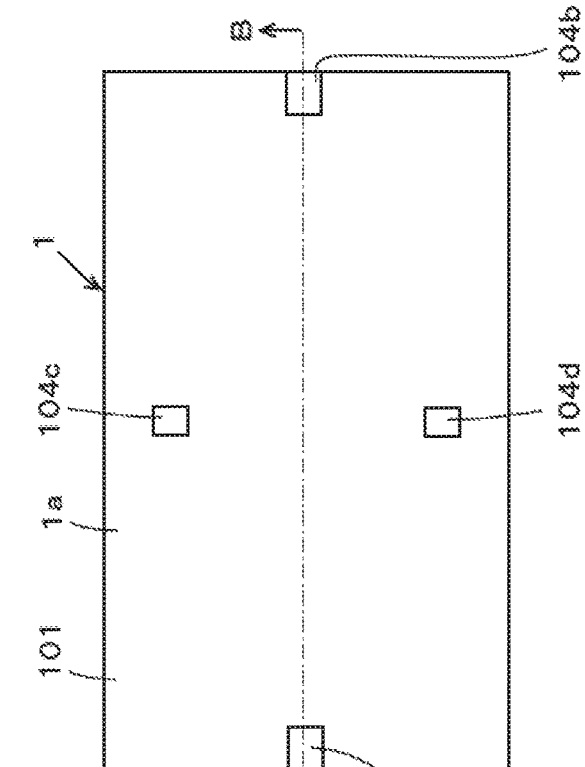
Figure 5D:
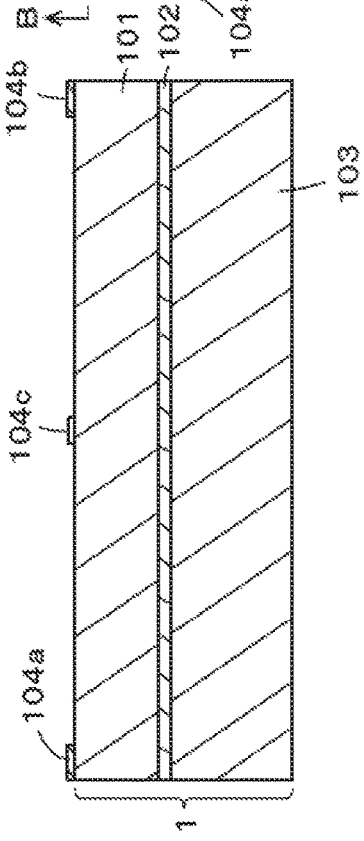

FIG. 1 shows a perspective view for explaining an example of first configuration of vibrational energy harvester device 10. First configuration of vibrational energy harvester device 10 comprises semiconductor substrate 1, movable part 2 formed by a semiconductor manufacturing process described later, fixed parts 3A,3B, and support beams 4L,4R.

Movable part 2 having a cross section of long rectangle is configured to be able to vibrate in the vibration direction along the longitudinal direction of movable part 2 as shown with arrow AR in FIG. 1. Namely, both ends of movable part 2 in the longitudinal vibration direction are supported by support beams 4L,4R formed on semiconductor substrate 1 by a semiconductor manufacturing process so that movable part 2 can vibrate. In this example, movable part 2 vibrates along the surface of semiconductor substrate in a direction orthogonal to the direction indicated with arrow B in FIG. 1 which is orthogonal to the surface of semiconductor substrate 1.

Support beams 4L,4R comprise each two pieces of thin plates 41,42 and thin plates 43,44 provided as extending in a direction orthogonal to the vibration direction. Support beams 4L,4R are attached to support beam holding sections 6L,6R formed on semiconductor substrate 1 to surround spaces 5L,5R formed at both sides of movable part 2 in the vibration direction.

Both ends 2a,2b of movable part 2 in the longitudinal direction can shift in the vibration direction while the both ends are bound with support beams 4L,4R at the center between thin plates 41,42 and 43,44.

In this example, support beams 4L,4R comprise each two pieces of thin plates 41,42 and 43,44 so that movable part 2 tends to vibrate without deflection and stably in the direction along arrow AR without contacting fixed parts 3A,3B opposing, although support beams 4L,4R may comprise a piece of thin plate.

In this example, fixed parts 3A,3B are provided at a position that sandwiches movable part 2 in a direction orthogonal to the vibration direction of movable part 2. Fixed parts 3A,3B have each of surfaces 31A,31B along the vibration direction of movable part 2 parallel to a direction indicated with arrow B in FIG. 1 orthogonal to the surface of substrate. Surface 31A of fixed part 3A is opposed to surface 21 along the vibration direction of movable part 2 parallel to a direction orthogonal to the surface of substrate through a gap. Surface 31B of fixed part 3B is opposed to surface 22 along the vibration direction of movable part 2 parallel to a direction orthogonal to the surface of substrate through a gap. For the purpose of explanation, surfaces 21,22,31A,31B may be indicated as opposing surfaces 21,22,31A,31B.

Opposing surfaces 21,22 of movable part 2 are provided with a plurality of projections 23,24 which project in a direction orthogonal to the vibration direction and are disposed to form a shape like comb teeth in the vibration direction. As well, opposing surface 31A of fixed part 3A and opposing surface 31B of fixed part 3B are provided with a plurality of projections 32A,32B which project in a direction orthogonal to the vibration direction and are disposed to form a shape like comb teeth in the vibration direction. In this example, projections 23,24,32A,32B are similarly formed into a ridge having a rectangular cross section extending in the direction indicated with arrow B. In this example, depression portions are formed between projections 23,24,32A,32B each formed in a shape of salient.

FIG. 2 is a plan view showing an opposing part between fixed part 3A and movable part 2, viewed from the above in a direction orthogonal to the vibration direction of movable part 2 along the direction indicated with arrow B in FIG. 1, in which movable part 2 remains still. In FIG. 2, a plurality of projections 23 formed on opposing surface 21 of movable part 2 have the same width Wt along the vibration direction and the same array pitch in the vibration direction as those of a plurality of projections 32A formed on opposing surface 31A of fixed part 3A. Therefore, there is gap Wb=L−Wt between projections 23 and 32A adjacent to each other.

When movable part 2 remains still as shown in FIG. 2, a plurality of projections 23 formed on opposing surface 21 of movable part 2 are opposed to a plurality of projections 32A formed on opposing surface 31A of fixed part 3A. Height Hm of projection 23 as a length along the vibration direction of a plurality of projections 23 disposed in the vibration direction on opposing surface 21 of movable part 2 is not constant but changes sinusoidally. Similarly, Height Hs of projection 32A as a length orthogonal to the vibration direction of a plurality of projections 32A disposed in the vibration direction on opposing surface 31A of fixed part 3A is not constant but changes sinusoidally.

In FIGS. 1 and 2, vibrational energy harvester device 10 is provided with about a dozen pieces of projections 23,24 of movable part 2 as well as about a dozen pieces of projections 32A,32B of fixed parts 3A,3B for the purpose of simple illustration, although it should be provided with more pieces thereof actually. Further, in FIGS. 1 and 2, the sinusoidally changing heights of projections 23,24,32A,32B have only a single cycle, although they should have a plurality of cycles depending on the number of projections.

In this example, when movable part 2 remains still as shown in FIG. 2, heights Hm,Hs of projections 23,32A are changed as keeping the same gap gs between a plurality of projections 23 and a plurality of projections 32A which are opposed to each other. Further in this example, even when projections 23,32A having the maximum Hm,Hs are opposed to each other as shown in FIG. 2, there remains narrow gap gmin therebetween.

Therefore, because there is gap g at the minimum even when heights Hm,Hs of projections 23,32A of movable part 2 and fixed part 3A are changing in the vibration direction indicated with arrow AR in FIGS. 1 and 2, movable part 2 can vibrationally shift in the vibration direction as keeping gap g with respect to fixed part 3A.

Besides, there is a gap of distance D between opposing surface 21 at the base position of projection 23 of movable part 2 and opposing surface 31A at the base position of projection 32A of fixed part 3A.

Parameters in this example are as follows: Wt=20 μm; Wb=40 μm; L=60 μm; Hm(Maximum level)=Hs(Maximum level)=42.5 μm; g=5 μm; and D=90 μm. The vibrational energy harvester device may have 12 mm of length along the vibration direction of movable part 2 and 8 mm of length along a direction orthogonal to the vibration direction.

Although FIG. 2 illustrates the relation between projection 32A and projection 23 only, the relation between a plurality of projections 32B formed on opposing surfaces 31B of fixed part 3B and a plurality of projections 24 formed on opposing surfaces 22 of movable part 2 is configured in the same manner. In this example, the positional relation (opposing phase relation) between projections 24 formed on opposing surfaces 22 of movable part 2 and projections 32B formed on opposing surfaces 31B of fixed part 3B is the same as the positional relation (opposing phase relation) between projections 23 formed on opposing surfaces 21 of movable part 2 and projections 32A formed on opposing surfaces 31A of fixed part 3A shown in FIG. 2 in which movable part 2 remains still. Namely, the opposing phase between projection 23 of movable part 2 and projection 32A of fixed part 3A is the same as the opposing phase between projection 24 of movable part 2 and projection 32B of fixed part 3B.

In this example, any one of fixed parts 3A,3B and movable part 2 is provided with an electret film and has an electret electric potential E. In this example, fixed parts 3A,3B may be provided with electret films and have electret electric potential E of −400 volts. Besides, fixed parts 3A,3B are electrically insulated from movable part 2 by the insulating layer of semiconductor substrate.

As shown in FIG. 1, movable part 2 is provided with electrodes 25,26 at both ends in the vibration direction while fixed parts 3A,3B are provided with electrodes 33A,33B at the ends of movable part 2 in a direction orthogonal to the vibration direction. These electrodes 25,26,33A,33B can be used as connection terminal electrodes for connecting vibrational energy harvester device 10 to a charging circuit.

With such a configuration, capacitance between fixed parts 3A,3B and movable part 2 can be changed according to the vibration of movable part 2. FIGS. 3 (A), (B) and (C) show the opposing phase relation between projection 23 of opposing surface 21 of movable part 2 vibrating and projection 32A of opposing surface 31A of fixed part 3A, as well as the relation to the capacitance. The same explanation can be applied to the opposing phase relation between projection 24 of opposing surface 22 of movable part 2 vibrating and projection 32B of opposing surface 31B of fixed part 3B, as well as the relation to the capacitance.

Namely, FIG. 3 (A) shows projection 23 of movable part 2 positioned in the center between adjacent projections 32A of fixed part 3A while tip end faces of projections 23,32A are not opposed to each other in a direction orthogonal to the vibration direction. As shown in FIG. 3 (A), the tip end face of projection 23 of movable part 2 is opposed through distance D to opposing surface 31A of fixed part 3A while the capacitance between movable part 2 and fixed part 3A is C (Low) at a low level.

In FIG. 3 (C), tip end face of projection 23 of movable part 2 is entirely opposed to tip end face of projection 32A of fixed part 3A in a direction orthogonal to the vibration direction. As shown in FIG. 3 (C), the tip end face of projection 23 of movable part 2 is opposed through a gap (g at the minimum level) to the tip end face of opposing surface 31A of fixed part 3A while the capacitance between movable part 2 and fixed part 3A is C (High) at a high level.

In FIG. 3 (B), tip end face of projection 23 of movable part 2 is partially opposed to tip end face of projection 32A of fixed part 3A in a direction orthogonal to the vibration direction. FIG. 3 (B) shows an intermediate condition between FIG. 3 (A) and FIG. 3 (C), while the capacitance between movable part 2 and fixed part 3A is C (Middle) at an intermediate level between C (Low) at the low level and C (High) at the high level.

As described above, vibrational energy is applied externally to this configuration of vibrational energy harvester device 10 to vibrate movable part 2, so that capacitance between movable part 2 and fixed parts 3A,3B is changed and AC electric power is output according to external force and vibration speed. Such generated AC electric power output from vibrational energy harvester device 10 can be supplied to a load or charged in a charging element.

With respect to equivalent circuit of vibrational energy harvester device 10, Formula 1 in FIG. 19 shows a matrix of linear equation where symbol f indicates external force, symbol i indicates output electric current, symbol e indicates output voltage, symbol v indicates vibration speed excited by external force, symbol Zm indicates output impedance, symbol Co indicates capacitance generated by vibrational energy harvester device 10 and symbol Cs indicates floating capacitance. In Formula 1, symbol A indicates force factor (electromechanical conversion factor) expressed by Formula 2 shown in FIG. 19.

In Formula 2, symbol n indicates the number of projections opposed to each other between movable part 2 and fixed parts 3A,3B, where symbol $\varepsilon_0$ indicates permittivity of free space, symbol b indicates thickness of vibrational energy harvester device 10, symbol E indicates electret electric potential and symbol $d_o$ indicates gap between projections 23,24 of movable part 2 and projections 32A,32b of fixed parts 3A,3B.

In this configuration of vibrational energy harvester device 10, force factor (electromechanical conversion factor) A changes as gap $d_o$ changes because gap $d_o$ between projections 23,24 of movable part 2 and projections 32A, 32B of fixed parts 3A,3B changes according to the vibration amplitude in the vibration direction of movable part 2.

Namely, as shown in FIG. 2, when the vibration amplitude is as small as array pitch L of projections 23,24,32A,32B, gap $d_o$ between projections 23,24 and projections 32A,32B becomes as great as gap gs corresponding to movable part 2 remaining still.

Therefore, force factor (electromechanical conversion factor) A in Formula 2 becomes relatively small.

Output impedance Zm of vibrational energy harvester device 10 becomes greater according to Formula 3 (Zm=r/$A^2$) shown in FIG. 19, where symbol r indicates mechanical resistance (damping resistance) of vibrational energy harvester device 10. Output electric current i of vibrational energy harvester device 10 is small according to Formula 4 (i=Af/Zm) shown in FIG. 19. Output voltage e of vibrational energy harvester device 10 according to Formula 5 (e=f/A) shown in FIG. 19 becomes at a level enough to make the diode conductive to rectify output electric current of vibrational energy harvester device 10 because output impedance Zm is great.

As described above, even when a low excitation vibration acceleration is applied to vibrational energy harvester device 10 with a small vibration amplitude, output voltage e of vibrational energy harvester device 10 becomes at a level enough to make the rectifying diode conductive because of great output impedance Zm of vibrational energy harvester device 10, so that even small output electric current i can charge the charging element.

Further, because gap $d_o$ between projections 23,24 and projections 32A,32B is relatively great under a low excitation vibration acceleration from quiescent condition as shown in FIG. 2, capacitance between movable part 2 and fixed parts 3A,3B decreases to decrease electrostatic binding force, so that movable part 2 of vibrational energy harvester device 10 can easily vibrate. Accordingly, this configuration of vibrational energy harvester device 10 can vibrate efficiently as responding to external force of which excitation vibration acceleration is low, so that power generation and charging can be performed efficiently even with small output electric current.

When the external force becomes greater and the vibration amplitude of vibrational energy harvester device 10 becomes greater, gap $d_o$ between projections 23,24 and projections becomes narrower than that of low acceleration condition as shown in FIG. 4. Therefore, force factor (electromechanical conversion factor) A in Formula 2 shown in FIG. 19 increases. Then, output impedance Zm according to Formula 3 shown in FIG. 19 decreases, and electric current i according to Formula 4 shown in FIG. 19 increases. On the other hand, output voltage e of vibrational energy harvester device 10 according to Formula 5 shown in FIG. 19 decreases as force factor (electromechanical conversion factor) A increases while output voltage e remains a value enough to make the diode conductive to rectify output electric current of vibrational energy harvester device 10.

Accordingly in the above-described configuration of vibrational energy harvester device 10, output impedance Zm of vibrational energy harvester device 10 decreases when the vibration amplitude is great at a high excitation vibration acceleration to increase output electric current i of vibrational energy harvester device 10, so that the rectifying diode becomes conductive according to output voltage e of vibrational energy harvester device 10 to charge the charging element with great output electric current i.

As described above, output impedance of this configuration of vibrational energy harvester device 10 increases at a low excitation vibration acceleration and decreases at a high excitation vibration acceleration. Accordingly, vibrational energy harvester device 10 can drive the rectifying circuit efficiently to charge electricity at values of output electric current and output voltage at the time of vibration response to the excitation vibration acceleration of environmental vibrational energy distributed widely from low to high acceleration condition.

In FIG. 1, symbol 7 indicates a weight which is not made from semiconductor substrate 1 but is separately prepared and attached onto movable part 2 of the first configuration of vibrational energy harvester device 10. When weight 7 is placed on movable part, mass m of movable part 2 increases to increase output P (see Formula 6 in FIG. 19) of vibrational energy harvester device 10.

In Formula 6 shown in FIG. 19, symbol m indicates mass of movable part 2 including weight 7, symbol x indicates vibration amplitude, symbol w indicates angular velocity and symbol Q indicates sharpness (so-called Quality factor) at the time of resonance of movable part 2, wherein the Q factor is a ratio of vibration amplitude of movable part 2 per external excitation vibration amplitude. It is apparent from Formula 6 that greater electricity can be output by the first configuration of vibrational energy harvester device 10 in which weight 7 is attached onto movable part 2.

A prior art document (JOURNAL OF MICROELECTROMECHANICAL SYSTEM, VOL.20, NO. 6, DECEMBER 2011) discloses a vibrational energy harvester device provided with projections like comb teeth which engage to each other while the movable part vibrates in the height direction of the engaging projections.

However, because the movable part vibrates as approaching the fixed part or going away, this kind of vibrational energy harvester device might not be able to continue to vibrate because of pull-in phenomenon caused by electrostatic force. It is because the pull-in phenomenon might stop vibration when the movable part approaches the fixed part by ⅓ or more of length of gap between two opposing surfaces under a condition in which electrostatic force acts between two surfaces opposing to each other through a gap.

On the other hand, vibrational energy harvester device 10 in this example has movable part 2 to vibrationally shift along the opposing surfaces 21,22,31A,31B while a gap of at least gmin is provided between projections 23,24 in the array like comb teeth formed on opposing surfaces 21,22 and projections 32A,32B in the array like comb teeth formed on opposing surfaces 31A,31B of fixed parts 3A,3B.

Therefore, the pull-in phenomenon does not occur in vibrational energy harvester device 10 in this example because movable part 2 vibrationally shifts in a direction orthogonal to gap gmin while keeping gap gmin at the minimum between fixed parts 3A,3B. Therefore, vibrational energy harvester device 10 in this example has an advantage that the amplitude of vibration of movable part 2 is not limited in principle.

Also, the vibrational energy harvester device in this example has an advantage that external vibrational energy can grow the vibration easily because of smaller electrostatic binding force generated at the start of vibration.

[Manufacturing Method of the First Configuration of Vibrational Energy Harvester Device]

As described above, the first configuration of vibrational energy harvester device 10 is a MEMS device formed by performing a semiconductor process to semiconductor substrate 1. The semiconductor substrate may be made of single-crystal silicon substrate, polycrystalline silicon substrate, SOI (Silicon on Insulator) substrate, ceramic substrate, metal substrate, glass substrate, polymer substrate or the like. Specifically, SOI substrate is selected as a semiconductor substrate for explaining this example of semiconductor manufacturing process about vibrational energy harvester device 10.

FIGS. 5 to 9 show an example of semiconductor manufacturing process about vibrational energy harvester device 10.

Prior to performing the semiconductor process, semiconductor substrate 1 made of SOI substrate is prepared. Vibrational energy harvester device 10 is separated by etching from semiconductor substrate 1 finally. For the purpose of convenience, the process will be explained for one vibrational energy harvester device 10. FIG. 5 (A) shows semiconductor substrate 1 of one vibrational energy harvester device 10, in which vertical length X is 12 mm and horizontal length Y is 8 mm, for example. FIG. 5 (B) shows a cross section of semiconductor substrate 1 cut in a direction orthogonal to substrate surface 1a. FIG. 5 (B) shows an A-A line cross section of FIG. 5 (A).

As shown in FIG. 5 (B), semiconductor substrate 1 provided with a plurality of layers in a direction orthogonal to substrate surface 1a comprises SOI layer 101 forming substrate side 1a, embedded oxide film layer 102 and handle layer 103. In this example, SOI layer 101 is made of P type silicon layer having thickness of 300 µm and specific resistance of 0.1 Ωcm. Embedded oxide film layer 102 is an insulative layer having thickness of 2 µm. Handle layer 103 is made of P type silicon layer having thickness of 500 µm and specific resistance of 0.1 Ωcm.

As shown in FIG. 5 (C) which shows a cross section at the same position as FIG. 5 (B), silicon nitride ($Si_3N_4$) film 104 is formed on the surface (substrate surface 1a) of SOI layer 101 by LPCVD (Low Pressure Chemical Vapor Deposition) method. On silicon nitride film 104, electrodes 25,26,33A, 33B shown in FIG. 1 are supposed to be formed later.

Silicon nitride film 104 is subject to a patterning process to leave sites 104a,104b,104c,104d for forming electrodes 25,26,33A,33B by removing the other parts. FIG. 5 (E) shows semiconductor substrate 1 viewed from substrate surface 1a similarly to FIG. 5 (A) while FIG. 5 (D) shows a B-B line cross section of FIG. 5 (E).

As shown in FIG. 6 (A) with hatching, the patterning process is performed to substrate surface 1a of semiconductor substrate 1 coated with resist film 105 of which sites for forming movable part 2, fixed parts 3A,3B and support beams 4L,4R are masked to leave the sites. FIG. 6 (A) shows semiconductor substrate 1 viewed from substrate surface 1a similarly to FIG. 5 (A) while FIG. 6 (B) shows a C-C line cross section of FIG. 6 (A).

In FIGS. 6 to 8 of the process for manufacturing a semiconductor, vibrational energy harvester device 10 is provided with several pieces of projections 23,24 of movable part 2 as well as several pieces of projections 32A,32B of fixed parts 3A,3B for the purpose of simple illustration, although it should be provided with more pieces thereof practically. In FIGS. 6 to 8 of the process for manufacturing a semiconductor, all projections 23,24 of movable part 2 have the same height as those of projections 32A,32B of fixed parts 3A,3B for the purpose of simple illustration, although they should have various heights different in the vibration direction as shown in FIG. 2.

As shown in FIG. 6 (C) showing a cross section at the same position as FIG. 6 (B), deep etching is performed by ICP (Inductively Coupled Plasma)-RIE (Reactive Ion Etching) to remove parts other than the surface masked with resist film 105 of SOI layer 101 up to embedded oxide film layer 102.

Next, resist film 105 is removed to expose SOI layer 101 as shown in FIGS. 6 (D) and (E). FIG. 6 (D) is a B-B line cross section view of FIG. 6 (E) showing semiconductor substrate 1 viewed from substrate surface 1a.

Next, resist film 106 patterned to mask the surface, other than movable part 2 and support beams 4L,4R, shown with hatching in FIG. 7 (A) is formed on bottom side 1b (exposed surface of handle layer 103) opposite to substrate surface 1a of semiconductor substrate 1. Namely, semiconductor substrate 1 is subject to the bottom-side resist patterning process. FIG. 7 (B) is a E-E line cross section view of FIG. 7 (A) showing semiconductor substrate 1 viewed from bottom side 1b.

As shown in FIG. 7 (C) showing a cross section at the same position as FIG. 7 (B), deep etching is performed by ICP-RIE to remove parts other than the surface masked with resist film 106 of handle layer 103 up to embedded oxide film layer 102.

Next, resist film 106 is removed to expose handle layer 103 on bottom side 1b as shown in FIGS. 7 (D) and (E). FIG. 7 (D) is a F-F line cross section view of FIG. 7 (E) showing semiconductor substrate 1 viewed from bottom side 1b.

Next, the exposed part of embedded oxide film layer 102 is removed by etching with a buffer solution of hydrofluoric acid so that movable part 2 and support beams 4L,4R are movable as shown in FIG. 8 (A) of cross section at the same position as FIG. 7 (D).

Next, a bubbling oxidation process is performed with KOH (potassium hydroxide) solution to form potassium-containing oxide film 107 as shown in FIG. 8 (B) of cross section at the same position as FIG. 8 (A). Potassium-containing oxide film 107 having a thickness of 1 μm or the like contributes to the electret process for forming an electret film described later. The bubbling oxidation process with KOH solution may be performed according to JP2016-82836-A with FIGS. 2 and 3 and explanation thereof. Details are not explained here.

Next, silicon nitride films 104a,104b,104c,104d are removed by etching as shown in the cross section of FIG. 8 (C) to form the electrodes 25,26,33A,33B at the etched sites.

As described above, components of this example of vibrational energy harvester device are made as shown in FIG. 8 (D) from semiconductor substrate 1.

Any one of movable part 2 and fixed parts 3A,3B of vibrational energy harvester device shown in FIG. 8 (D) is subject to electret process to form an electret film. In this example, negatively-electrified electret film is formed on fixed parts 3A,3B. The electret process may be performed according to the Bias-Temperature method disclosed in JP2013-13256-A. Details are not explained here.

Figure 9:
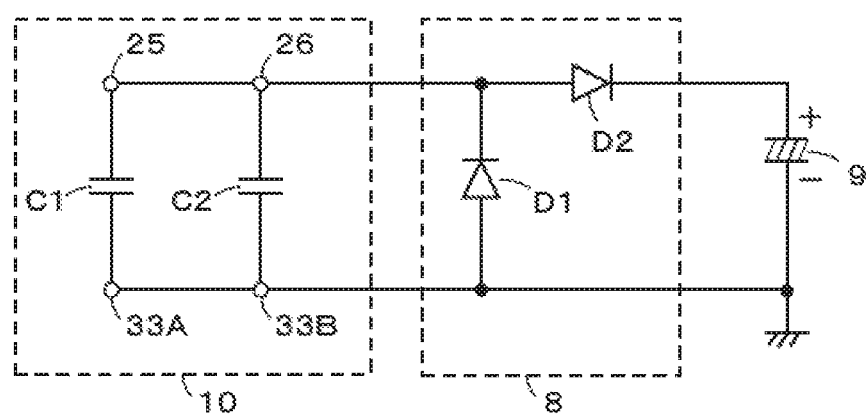
FIG. 9 is a circuit diagram showing an example f charging circuit according to the first configuration of vibrational energy harvester device.

FIG. 9 shows an example of circuit configuration of charging circuit of vibrational energy harvester device 10. As shown in FIG. 9 of vibrational energy harvester device 10 in this example, capacitances C1,C2 are connected in parallel, the capacitance C1 being generated between electrode 25 of movable part 2 and electrode 33A of fixed part 3A, the capacitance C2 being generated between electrode 26 of movable part 2 and electrode 33B of fixed part 3B. In this example, vibrational energy harvester device 10 has capacitance C, wherein C=C1+C2.

In FIG. 9, electricity output from vibrational energy harvester device 10 having capacitance C is rectified by rectifying circuit 8 consisting of diodes D1,D2 to charge charging capacitor 9 with the rectified output.

Modified Example of First Configuration

It is possible that projections 23,24 of movable part 2 and 32A,32B of fixed part 3A,3B have different widths in the vibration direction from viewpoints of easiness of vibrating movable part 2 and efficiency of utilizing great electric current at a high acceleration although all widths of projections 23,24,32A,32B are uniform in the first configuration of vibrational energy harvester device 10.

Figure 10:
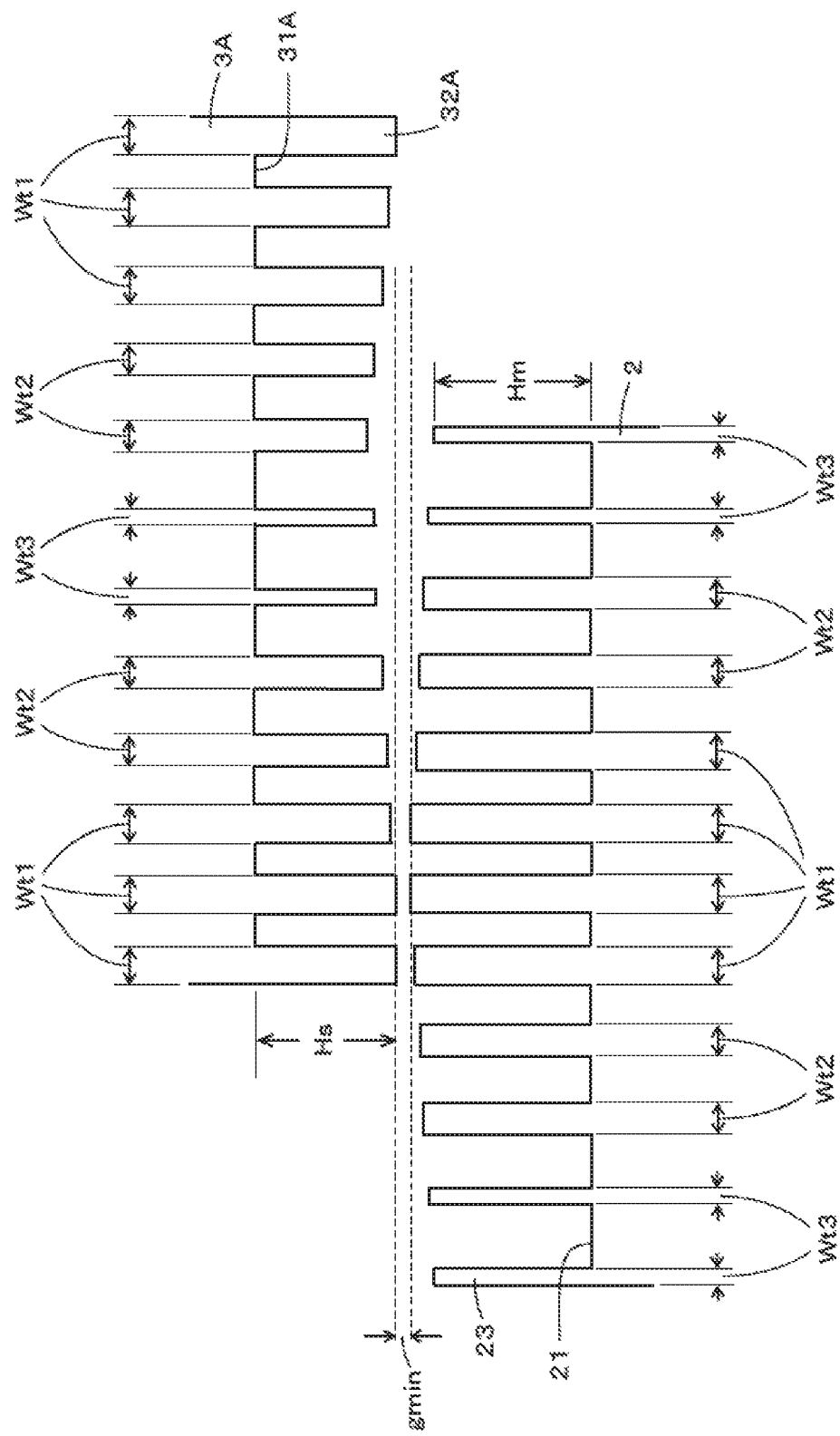
FIG. 10 is an explanation view showing a main part of a modified example of the first configuration of our vibrational energy harvester device.

FIG. 10 shows an opposing part between movable part 2 and fixed part 3A in vibrational energy harvester device 10A in which projections 23,24,32A,32B have different widths. Another opposing part between movable part 2 and fixed part 3B should be configured as well.

FIG. 10 shows a plurality of projections 23 of movable part 2 having heights Hm and a plurality of projections 32A of fixed part 3A having heights Hs, in which the width in the vibration direction becomes wider as heights Hm,Hs become higher while the width in the vibration direction becomes narrower as heights Hm,Hs become lower.

In FIG. 10, four projections 23 having heights Hm higher at the center of movable part 2 have width Wt1 along the vibration direction while four projections 23 which have lower heights Hm and consist of each two at both sides of the center have width Wt2 along the vibration direction narrower than width Wt1. Further, four projections 23 which have lower heights Hm and consist of each two at both left and right sides of the center have width Wt3 along the vibration direction narrower than width Wt2.

In FIG. 10, six projections 32A which have higher heights Hs and consist of each three at both left and right sides of fixed part 3A have width Wt1 along the vibration direction while four projections 32A which have lower heights Hs and consist of each two adjacent to both sides have width Wt2 along the vibration direction narrower than width Wt1. Further, two projections 32A at the center which have lower heights Hs have width Wt3 along the vibration direction narrower than width Wt2.

Therefore, when movable part 2 of vibrational energy harvester device 10A remains still, four projections 23 having wider width Wt1 at the center of movable part 2 are opposed to two projections 32A having width Wt3 at the center of fixed part 3A and two projections 32A having width Wt2 adjacent to the center at both sides. On the other hand, three projections 32A having wider width of fixed part 3A are opposed to projections 23 of movable part 2 of which one projection has width Wt2 (<Wt1) and of which two projections have widths Wt3 (<Wt1). Namely, when movable part 2 of vibrational energy harvester device 10A shown in FIG. 10 remains still, a plurality of projections 23 of movable part 2 having different widths along the vibration direction are opposed to a plurality of projections 32A having different widths along the vibration direction.

Therefore, when movable part 2 of vibrational energy harvester device 10A shown in FIG. 10 remains still, a plurality of projections 23 of movable part 2 having different widths along the vibration direction are opposed to a plurality of projections 32A having different widths along the vibration direction while they are opposed through wide gap gs to each other, so that effective opposing surface contributing capacitance reduces. Accordingly, because electrostatic force opposing a force along the vibration direction in FIG. 2 becomes smaller, vibrational energy harvester device 10A is easier to vibrate than vibrational energy harvester device 10 shown in FIG. 2 when movable part 2 remains still.

When the acceleration is high, a plurality of projections 23 of movable part 2 having wider Wt1 are opposed to a plurality of projections 32A of fixed part 3A having wider Wt1 through narrow gap gmin as shown in FIG. 10, so that output impedance is small similarly to vibrational energy harvester device 10 described above. Therefore, even vibrational energy harvester device 10A in FIG. 10 has a great electric current at a high excitation vibration acceleration to charge a charging element efficiently.

Figure 11:
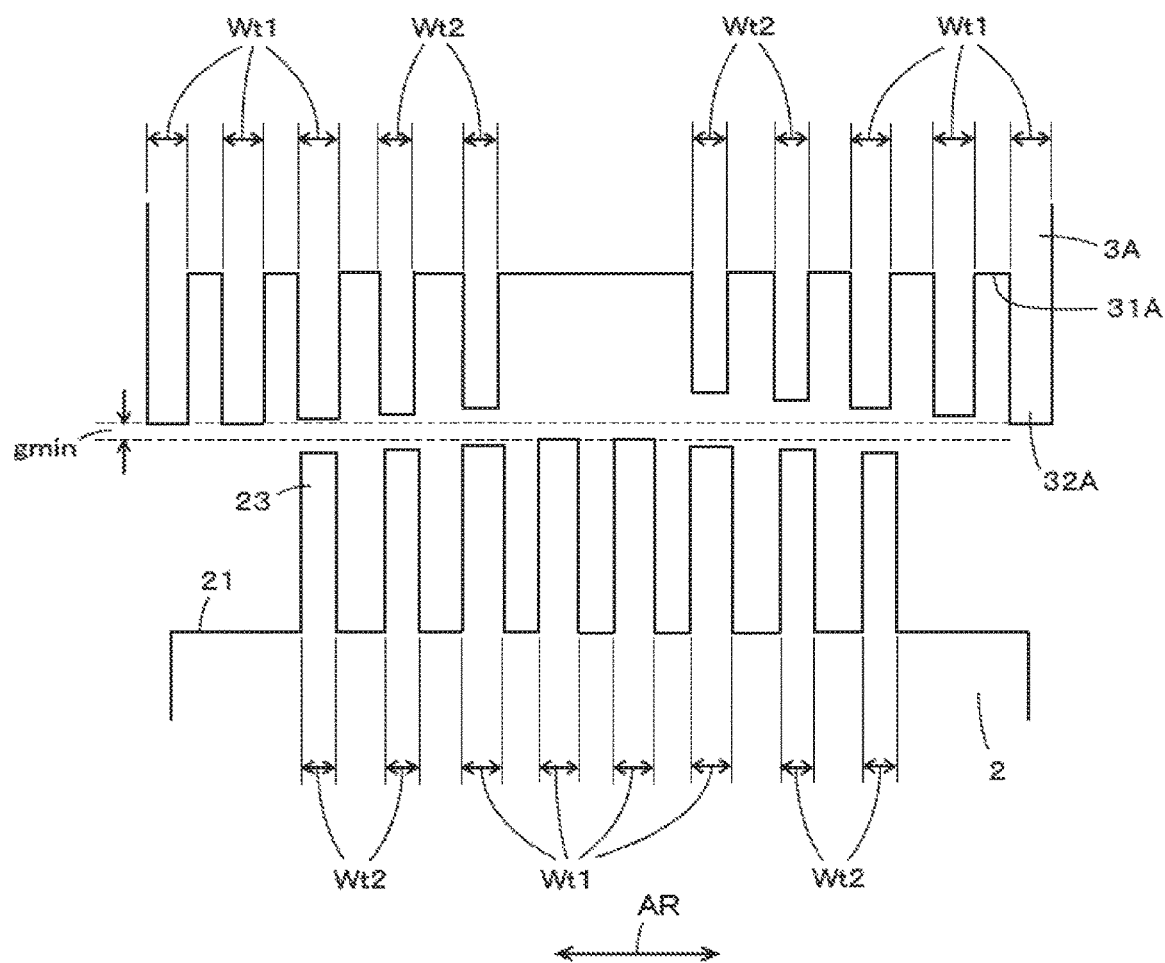
FIG. 11 is an explanation view showing a main part of another modified example of the first configuration of our vibrational energy harvester device.

In FIG. 10 of this configuration, it is thought that projections having narrower width along the vibration direction among projections 23,24,32A,32B of movable part 2 and fixed parts 3A,3B don't contribute so much to capacitance generated. Therefore the projections having narrower width along the vibration direction can be omitted. FIG. 11 shows a modified example of the configuration shown in FIG. 10 from this viewpoint.

Namely, projections 23,32A having the narrowest width Wt3 along the vibration direction shown in FIG. 10 are not provided in FIG. 11 of this configuration. Projections 24 on opposing surface 22 of movable part 2 opposed to fixed part 3B and projections 32B on opposing surface 31B of fixed part 3B are similarly configured. Accordingly, in FIG. 11 of the example of vibrational energy harvester device, projections 23,24 on opposing surfaces 21,22 of movable part 2 are formed to have different densities in the vibration direction of movable part 2 while projections 32A,32B on opposing surfaces 31A,31B of fixed parts 3A,3B are formed to have different densities in the vibration direction of movable part 2. Namely, projections 23,24 and 32A,32B are density-modulated in the vibration direction. Further, when movable part 2 remains still as shown in FIG. 11, a high density portion of movable part 2 with projections 23,24 is opposed to a low density portion of fixed parts 3A,3B without projections 32A,32B.

The vibrational energy harvester device shown in FIG. 11 of this example can achieve the same function effect as vibrational energy harvester device 10A shown in FIG. 10.

In FIG. 11 of this example, projections 23,24 of movable part 2 and projections 32A,32B of fixed parts 3A,3B are density-modulated in the vibration direction of movable part 2 in the configuration shown in FIG. 10. It is possible that projections 23,24 of movable part 2 and projections 32A, 32B of fixed parts 3A,3B are density-modulated in the vibration direction of movable part 2, so that number n of opposing projections in Formula 2 for force factor (electromechanical conversion factor) A shown in FIG. 19 can be changed to make the force factor (electromechanical conversion factor) A change between the small amplitude mode (at the time of low acceleration) and the large amplitude mode (at the time of high acceleration). Therefore, it is possible that heights Hm of projections 23,24 of movable part 2 and heights Hs of projections 32A,32B of fixed parts 3A,3B are all the same while the gaps between projections 23,24 on opposing surface 22 and 32A,32B on opposing surfaces 31A,31B are constant. Also, it is possible that projections 23,24,32A,32B have constant widths along the vibration direction.

It is possible that the recessed portion spaces formed between projections 23,24,32A,32B each formed in a shape of salient in the first configuration of vibrational energy harvester device 10 explained with FIGS. 1 to 8 are filled with dielectric material having a permittivity.

Figure 12:
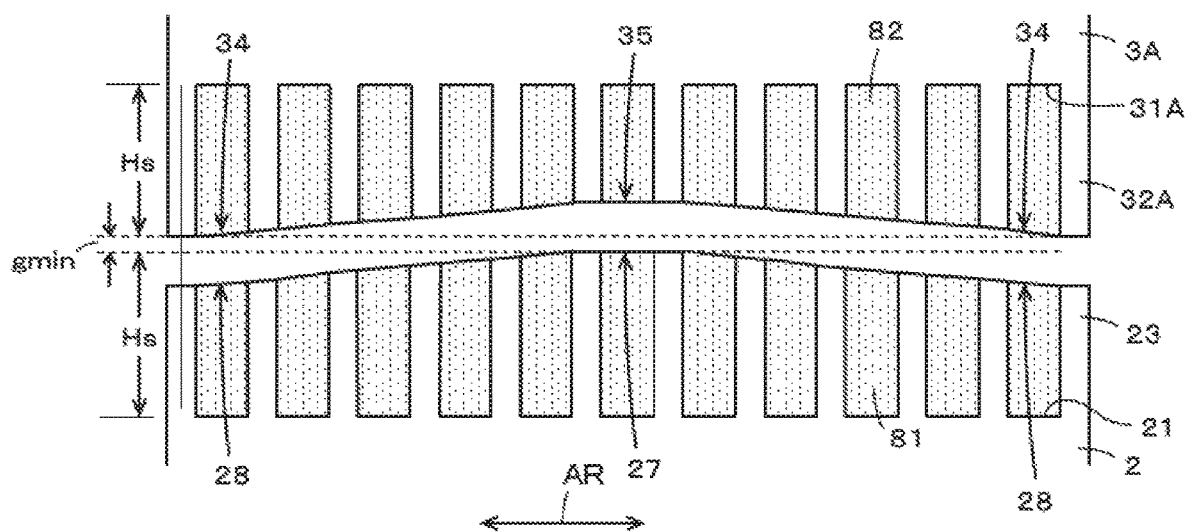
FIG. 12 is an explanation view showing a main part of yet another modified example of the first configuration of our vibrational energy harvester device.

FIG. 12 shows an opposing part between movable part 2 and fixed part 3A of a vibrational energy harvester device in which recessed portions between projections 23,32A are filled with dielectric materials 81,82 having a permittivity. Recessed portions between a plurality of projections 24,32B in another opposing part between movable part 2 and fixed part 3B should be configured as well. In this example, heights Hm,Hs of a plurality of projections 23,24,32A,32B changes sinusoidally along the vibration direction similarly to FIG. 2.

In the vibrational energy harvester device shown in FIG. 12, because recessed portions between a plurality of projections 23,24,32A,32B are filled with dielectric materials 81,82, a plurality of projections 23,24,32A,32B and the recessed portions therebetween don't constitute the salient and the recessed portion of our invention anymore. Instead, because heights Hm of a plurality of projections 23,24 of movable part 2 change sinusoidally in the vibration direction, movable part 2 is provided with salient 27 and recessed portions 28 as shown in FIG. 12. Further, because heights Hs of a plurality of projections 32A,32B of fixed part 3A change sinusoidally in the vibration direction, fixed parts 3A,3B are provided with projection salient 34 and recessed portions 35 as shown in FIG. 12.

The example of vibrational energy harvester device shown in FIG. 12 can achieve the same function effect as the above-described vibrational energy harvester devices.

Another Modified Example of First Configuration

In the above described first configuration of vibrational energy harvester device 10, surfaces 21,22 along the vibration direction at both ends of movable part 2 in a direction orthogonal to the vibration direction are provided with projections 23,24 which project like comb teeth, while surfaces 31A,31B opposed to surfaces 21,22 are provided with two fixed parts 3A,3B having surfaces 31A,31B opposed to surfaces 21,22 to form projections 32A,32B which project like comb teeth on surfaces 31A,32B, respectively. In this example, it is possible to form the projections at one end of movable part 2 and fixed part 3A or 3B, instead of forming them at both ends of movable part 2 in the direction orthogonal to the vibration direction.

In this example, it is possible to form electret films on movable part 2 instead of forming the electret film on fixed parts 3A,3B in the first configuration of vibrational energy harvester device 10.

In this example, it is possible to form electret films on at least opposing surfaces 31A,31B of fixed parts 3A,3B instead of forming the electret films on whole fixed parts 3A,3B in the first configuration of vibrational energy harvester device 10.

In this example, it is possible to form electret films on both of movable part 2 and fixed parts 3A,3B to negatively electrify one of them and positively electrify the other, instead of forming the electret film on any one of movable part 2 and fixed parts 3A,3B.

Besides, the semiconductor manufacturing process is not limited to the first configuration of vibrational energy harvester device 10 shown in FIGS. 5 to 8.

Second Configuration

In this example, it is possible that a plurality of pairs of projections oppose each other to form a shape like comb teeth on movable part and fixed part to provide a vibrational energy harvester device having a higher output although only a pair of projections are opposed to each other in the above-described example. Second configuration of vibrational energy harvester device configured as such will be explained.

Figure 13:
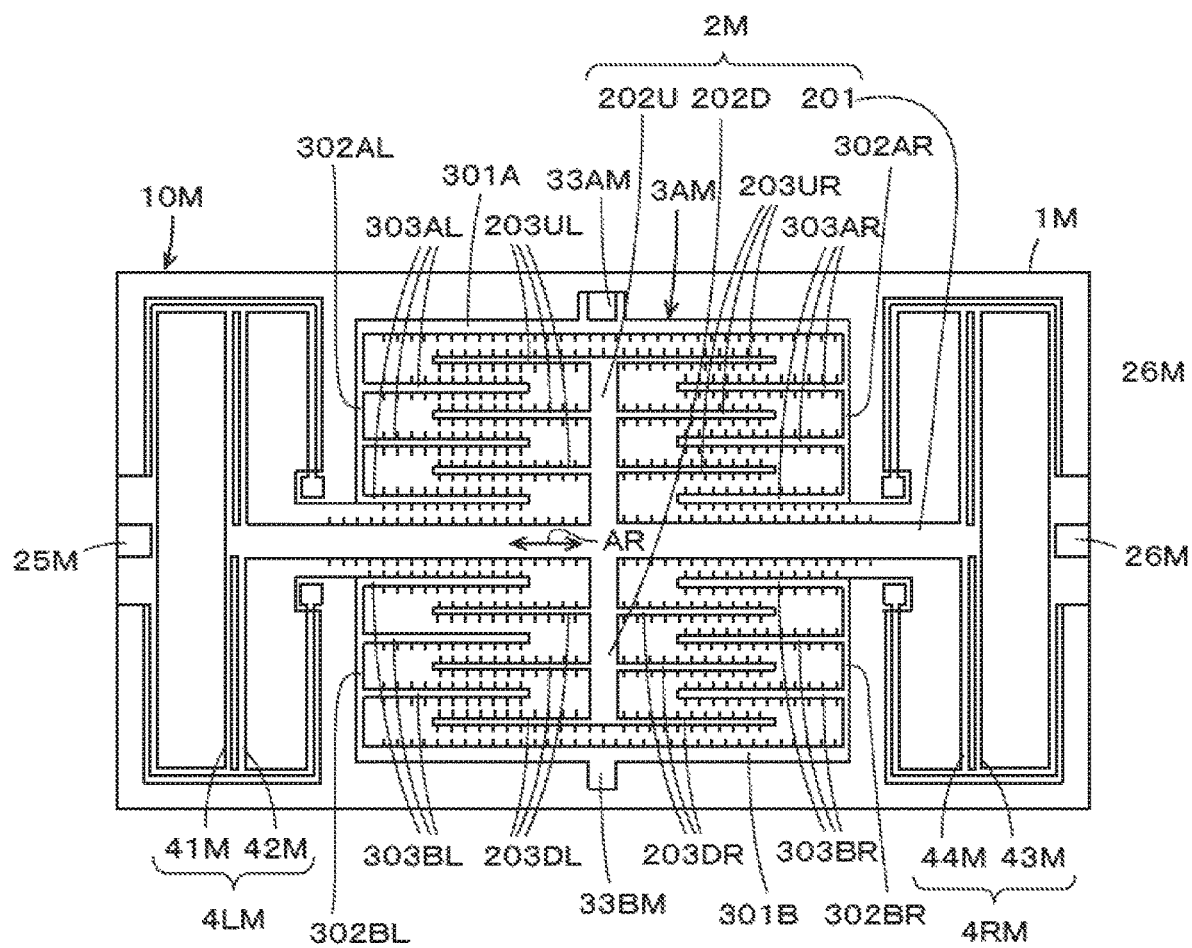
FIG. 13 is an explanation view showing an example of the second configuration of our vibrational energy harvester device.

FIG. 13 shows the second configuration of vibrational energy harvester device 10M viewed from substrate surface of semiconductor substrate 1M along a direction orthogonal to the substrate surface. The second configuration of vibrational energy harvester device 10M is manufactured for semiconductor substrate 1M by the same semiconductor manufacturing process as the first configuration of vibrational energy harvester device 10. Namely, almost the same explanation can be applied, except for the mask pattern with resist film for forming the movable part and fixed parts by etching. Vibrational energy harvester device 10M has 24 mm of length along the vibration direction and 15 mm of length along a direction orthogonal to the vibration direction, for example. In this example, the length along the thickness direction is the same as the first configuration.

In the second configuration shown in FIG. 13, fixed parts 3AM,3BM are opposed to movable part 2M at both sides in a direction orthogonal to the vibration direction of movable part 2M, in the same manner as the first configuration of vibrational energy harvester device 10.

Both ends of movable part 2M in the vibration direction are supported by support beams 4LM,4RM to vibrate in the direction shown in FIG. 13 with arrow AR, in the same manner as movable part 2 of the first configuration of vibrational energy harvester device 10.

Movable part 2M of vibrational energy harvester device 10M in the second configuration comprises: movable main shaft section 201; arms 202U,202D extending along a direction orthogonal to the vibration direction from both sides of movable main shaft section 201 almost at the center in the longitudinal direction; and a plurality of movable branches 203UL,203UR,203DL,203DR extending along the vibration direction shown with arrow AR from both left and right sides of each arm 202U,202D.

In this example, arm 202U projects from main shaft part 201 of movable part 2M toward fixed part 3AM. Further, arm part 202D projects from movable main shaft 201 of movable part 2M toward fixed part 3BM.

As shown in FIG. 13, three pieces of each of movable branch 203UL,203UR extend along the vibration direction of movable part 2M from both left and right sides of arm 202U through each gap in a direction orthogonal to the vibration direction. Further, three pieces of each of movable branch 203DL,203DR extend along the vibration direction of movable part 2M from both left and right sides of arm 202D, as shown in FIG. 13.

On the other hand, fixed part 3AM in the second configuration comprises: fixed main shaft section 301A in parallel to movable main shaft section 201 of movable part 2M; and arms 302AL,302AR extending from both ends in the longitudinal direction toward movable main shaft section 201. Arms 302AL,302AR are provided with fixed branches 303AL,303AR extending along the vibration direction shown with arrow AR from a surface opposing to arm 202U of movable part 2M.

In this example, three pieces of each of fixed branches 303AL,303AR are provided as corresponding to the number of movable branches 203UL,203UR while movable branches 203UL,203UR are engaged to fixed branches 303AL,303AR alternately as shown in FIG. 13.

Fixed part 3BM in the second configuration comprises: fixed main shaft section 301B in parallel to movable main shaft section 201 of movable part 2M; and arms 302BL, 302BR extending from both ends in the longitudinal direction toward movable main shaft section 201. Arms 302BL, 302BR are provided with fixed branches 303BL,303BR extending along the vibration direction shown with arrow AR from a surface opposing to arm 202D of movable part 2M.

In this example, three pieces of each of fixed branches 303BL,303BR are provided as corresponding to the number of movable branches 203DL,203DR while movable branches 203DL,203DR are engaged to fixed branches 303BL,303BR alternately as shown in FIG. 13.

Each number of movable branches and fixed branches may be 1, 2, 3 or more.

Figure 14A:
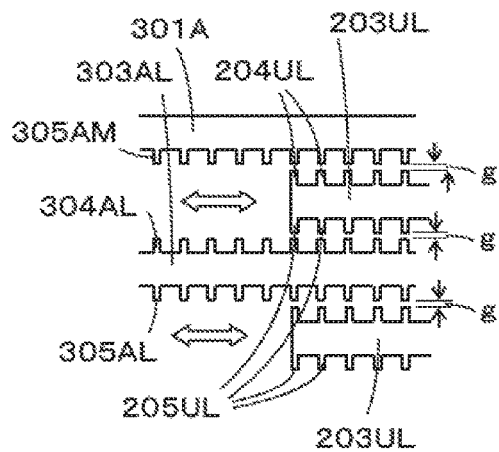
FIGS. 14A and 14B are explanation views showing a main part of the second configuration of our vibrational energy harvester device.
Figure 14B:
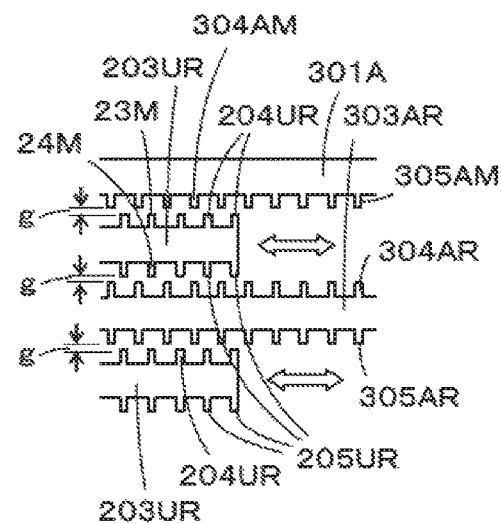

FIG. 14 (A) shows a partial enlarged view showing a condition in which fixed branch 303AL formed on left arm 302AL of fixed part 3AM engages with movable branch 203UL formed on the left side of arm 202U of movable part 2M. FIG. 14 (B) shows a partial enlarged view showing a condition in which fixed branch 303AR formed on right arm 302AR of fixed part 3AM engages with movable branch 203UR formed on the right side of arm 202U of movable part 2M.

As well, fixed branch 303BL formed on left arm 302BL of fixed part 3BM engages with movable branch 203DL formed on the left side of arm 202D of movable part 2M as shown in FIG. 14 (A) while fixed branch 303BR formed on right arm 302BR of fixed part 3BM engages with movable branch 203DR formed on the right side of arm 202D of movable part 2M as shown in FIG. 14 (B). Therefore, the relation between movable branch 203UL and movable branch 203UR and the relation between fixed branch 303AL and fixed branch 303AR will be explained as omitting the explanation of the relation between movable branch 203DL and movable branch 203DR and the relation between fixed branch 303BL and fixed branch 303BR.

As shown in FIG. 14 (A), projections 204UL,205UL are formed on surfaces along the vibration direction of movable branch 203UL opposed to fixed branch 303AL like projections 23,24 of movable part 2 in the first configuration. On the other hand, projections 304UL,305UL corresponding to projection 32A of fixed part 3A in the first configuration are formed on a surface of fixed branch 303AL opposed to movable branch 203UL.

In this example, dimensional relation between projections 204UL,205UL formed on movable branch 203UL of movable part 2M and projections 304AL,305AL formed on fixed branch 303AL is the same as that of the first configuration explained with reference to FIG. 2. Namely, projections 204UL,205UL,304AL,305AL have width Wt of 20 μm, array pitch L of 60 μm and height H of 42.5 μm, as well as minimum gap gmin between tip surface of projections 204UL,205UL and tip surface of projections 304AL,305AL of 5 μm.

As shown in FIG. 14 (B), projections 304AR,305AR are formed on surfaces along the vibration direction of movable branch 203UR opposed to fixed branch 303AR while projections 304AR,305AR are formed on a surface of fixed branch 303AR opposed to movable branch 203UR. Dimensional relation between projections 204UR,205UR formed on movable branch 203UR of movable part 2M and projections 304AR,305AR formed on fixed branch 303AR is the same as that of the dimensional relation between projections 204UL,205UL formed on movable branch 203UL of movable part 2M and projections 304AL,305AL formed on fixed branch 303AL.

In this example, fixed main shaft section 301 of fixed part 3AM is provided with projections 305AM like projections 304AL,305AL of fixed branch 303AL and projections 304AR,305AR of fixed branch 303AR. Further, movable main shaft section 201 of movable part 2M is provided with projections like projections 204UL,205UL,204UR,205UR of movable branch 203UL,203UR.

In FIGS. 13 and 14, there are a few pieces of projections 23,24 of movable part 2 as well as a few pieces of projections 32A,32B of fixed parts 3A,3B for the purpose of simple illustration, although there should be more pieces thereof practically. In FIGS. 13 and 14, all projections 23,24 of movable part 2 have the same height as those of projections 32A,32B of fixed parts 3A,3B for the purpose of simple illustration, although they should have various heights different in the vibration direction as shown in FIG. 2. It is possible that the structure is the same one as the modified example of the first configuration described above.

Generally in this kind of vibrational energy harvester device of electrostatic type, electrostatic force puts a break on movable structures so that it cannot move easily when the restoring force of support beams 4LM,4RM and electrostatic force between movable part 2M and fixed parts 3AM,3BM act in the same direction.

Accordingly, the second configuration can offset electrostatic effects between the left group and the right group, the left group consisting of left movable branch 203UL of arm 202U and left fixed branch 303AL of fixed part 3AM shown in FIG. 14 (A), the right group consisting of right movable branch 203UR of arm 202U and right fixed branch 303AR of fixed part 3AM shown in FIG. 14 (B), wherein an opposing phase of projections 204UL,205UL,304AL,305AL in the left group is different from another opposing phase of projections 204UR,205UR,304AR,305AR in the right group.

As shown in FIG. 13, difference of the phase between the left and right groups is 90 degrees when array pitch is 1 cycle (360 degrees). Namely, projections 204UR,205UR of movable branch 203UR shift by 90 degrees from projections 304AR,305AR of fixed branch 303AR instead of confronting in the right group shown in FIG. 14 (B) when projections 204UL,205UL of movable branch 203UL confront projections 304AL,305AL of fixed branch 303AL in the left group shown in FIG. 14 (A).

As well, electrostatic effects can be offset between the left group and the right group, the left group consisting of left movable branch 203DL of arm 202D and left fixed branch 303BL of fixed part 3BM, the right group consisting of right movable branch 203DR of arm 202D and right fixed branch 303BR of fixed part 3BM, wherein an opposing phase of projections 204DL,205DL,304BL,305BL in the left group is different from another opposing phase of projections 204DR,205DR,304BR,305BR in the right group.

As described above, in the second configuration of vibrational energy harvester device 10M, the opposing phases between projections of fixed parts 3AM,3BM and projections of movable part 2M belonging to divided two groups are different from each other, so that electrostatic forces acting between movable part 2M and fixed parts 3AM,3BM can have directions opposite to each other in the two groups and therefore the vibration is prevented from being suspended or deteriorated because of electrostatic force putting a brake on movable part 2M.

It is possible that projections of fixed part 3AM,3BM are divided along the vibration direction into two groups instead of dividing projections of movable part 2M in the vibration into two groups as described above.

The second configuration of vibrational energy harvester device 10M also has a weight placed on movable main shaft section 201 of movable part 2M, in the same manner as the first configuration of vibrational energy harvester device 10.

In the second configuration of vibrational energy harvester device 10M, electrodes 25M,26M are formed at both ends of movable part 2M while electrodes 33AM,33BM are formed on fixed parts 3AM,3BM, in the same manner as the first configuration of vibrational energy harvester device 10. Even in the second configuration of vibrational energy harvester device 10M, charging capacitor 9 can be charged with the charging circuit shown in FIG. 9.

In the second configuration, a plurality of capacitances between movable branches 203UL,203UR (including movable main shaft section 201) and fixed branches 303AL,303AR (including fixed main shaft section 301A) are connected in parallel between electrodes 25M,33AM corresponding to electrode 25,33A shown in FIG. 9. Similarly, a plurality of capacitances between movable branches 203DL,203DR (including movable main shaft section 201) and fixed branches 303BL,303BR (including fixed main shaft section 301B) are connected in parallel between electrodes 26M,33BM corresponding to electrode 26,33B shown in FIG. 9.

Accordingly, the second configuration of vibrational energy harvester device 10M having the same function as that of the first configuration can realize a broadband vibrational energy harvester device capable of increasing the vibrational power generation.

With the second configuration of vibrational energy harvester device 10M, since the opposing phases between projections of fixed parts and projections of a movable part belonging to divided two groups are different from each other, electrostatic forces acting between the movable part and the fixed part are offset so that the vibration is prevented from being suspended or deteriorated because of electrostatic force putting a brake on the movable part.

Modified Example of Second Configuration

The second configuration described above can combine movable part 2M and fixed part 3AM only, by omitting fixed part 3BM.

Further, it is possible to form a plurality of arms extending along a direction orthogonal to the vibration direction from the main shaft section 201 of movable part 2M in different positions in the vibration direction, wherein each arm and a site corresponding to each arm of fixed parts 3AM,3BM are configured as described above to make a structure comprising more pairs of movable parts and fixed parts.

Furthermore, it is possible that groups having different opposing phases of projection are positioned along a direction orthogonal to the vibration direction although the second configuration is provided with groups having different opposing phases of projection positioned along the vibration direction of movable part. Namely, the group having different opposing phases of projection may consist of the groups between movable part 2M and fixed parts 3AM,3BM. Of course such a configuration can be applied to the first configuration.

Further, the difference of opposing phases of projections may not be 90 degrees as described above, to the extent of contributing to the offset between electrostatic forces of the movable part and the fixed part.

Third Configuration

In the above-described configuration, a plurality of projections 23,24 like comb teeth having different heights Hm are formed on opposing surfaces 21,22 of movable part 2 while a plurality of projections 32A,32B like comb teeth having different heights Hs are formed on opposing surfaces 31A,31B of fixed parts 3A,3B. Instead of forming such projections like comb teeth, in the third configuration, shapes of opposing surfaces 21,22,3A,3B of movable part 2 and fixed parts 3A,3B are designed not to be flat but to change gaps between opposing surfaces 21,22,31A,31B of movable part 2 and fixed parts 3A,3B according to the amplitude of movable part 2 in the vibration direction.

Figure 15:
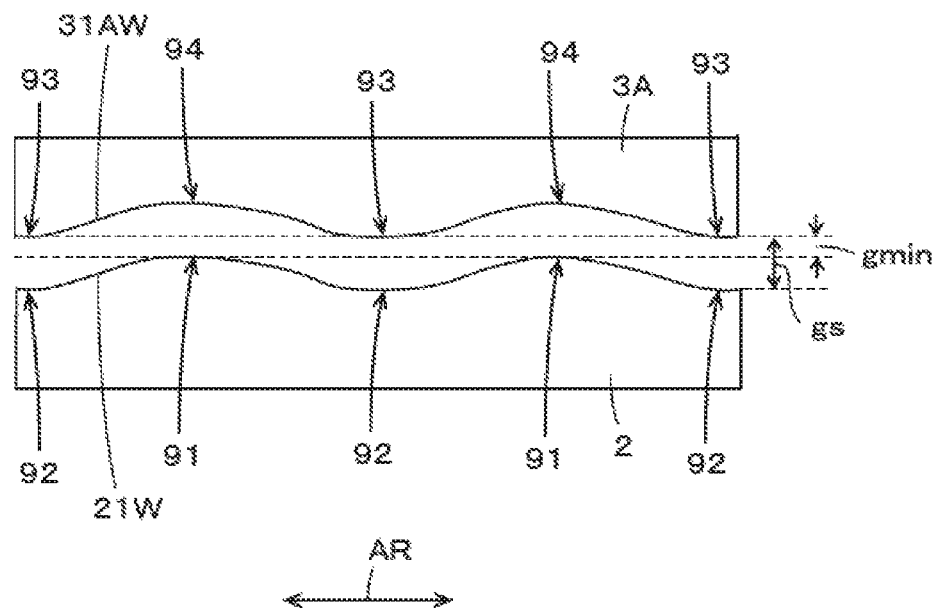
FIG. 15 is an explanation w showing a main part of the third configuration of our vibrational energy harvester device.

FIG. 15 is an explanation view showing a main part of the third configuration of vibrational energy harvester device in which opposing surfaces of movable part 2 and fixed part 3A.

In the example shown in FIG. 15, opposing surface 21W of movable part 2 opposed to fixed part 3A and opposing surface 31AW of fixed part 3A opposed to movable part 2 are not designed to be flat but shaped in sinusoidal waves having the same repetitive cycle in the vibration direction indicated with arrow AR of movable part 2.

Accordingly, the wave shape of opposing surface 21W of movable part 2 has salient 91 projecting toward opposing surface 31AW of fixed part 3A to form recessed portion 92 between two adjacent salients 91. As well, the wave shape of opposing surface 31AW of fixed part 3A has salient 93 projecting toward opposing surface 21W of movable part 2 to form recessed portion 94 between two adjacent salients 93.

When movable part 2 remains still as shown in FIG. 15, salient 91 on opposing surface 21W of movable part 2 is opposed to recessed portion 94 on opposing surface 31AW of fixed part 3A while recessed portion 92 of movable part 2 is opposed to salient 93 of fixed part 3A. Similarly to the first configuration, the gap between opposing surface 21W of movable part 2 and opposing surface 31AW of fixed part 3A is designed to be rather wide gap gs when movable part 2 remains still. Similarly to the first configuration, the gap between opposing surface 21W of movable part 2 and opposing surface 31AW of fixed part 3A is designed to be a narrow gap gmin (<gs) when movable part 2 vibrates to make salient 91 on opposing surface 21W of movable part 2 opposed to recessed portion 94 on opposing surface 31AW of fixed part 3A.

In the third configuration of vibrational energy harvester device, the relation between movable part 2 and fixed part 3B should be configured as well.

Therefore in the example of vibrational energy harvester device shown in FIG. 15, Formula 2 of $d_o=g_s$ shown in FIG. 19 is satisfied at a small vibration amplitude, so that force factor (electromechanical conversion factor) A decreases and output impedance increases. Further, Formula 2 of $d_o=$gmin shown in FIG. 19 is satisfied at a great vibration amplitude, so that force factor (electromechanical conversion factor) A increases and output impedance decreases. Accordingly, output electricity can be rectified and charged efficiently regardless of low or high acceleration in the third configuration of vibrational energy harvester device, as well as the first configuration of vibrational energy harvester device 10.

Of course the third configuration can be applied to the second configuration described above.

[Fourth Configuration]

In the above-described configuration, force factor (electromechanical conversion factor) A according to Formula 2 shown in FIG. 19 changes according to gap $d_o$ between movable part 2 and fixed parts 3A,3B, and therefore gap $d_o$ is increased when the vibration amplitude is small while being decreased when the vibration amplitude is great. It is apparently possible from Formula 2 shown in FIG. 19 that force factor (electromechanical conversion factor) A is changed according to electret electric potential E, other than gap $d_o$.

When electret film is formed on any one of fixed parts 3A,3B and movable part 2 in the fourth configuration, electret electric potential E is changed along the vibration direction of movable part 2 to change force factor (electromechanical conversion factor) A.

Figure 16:
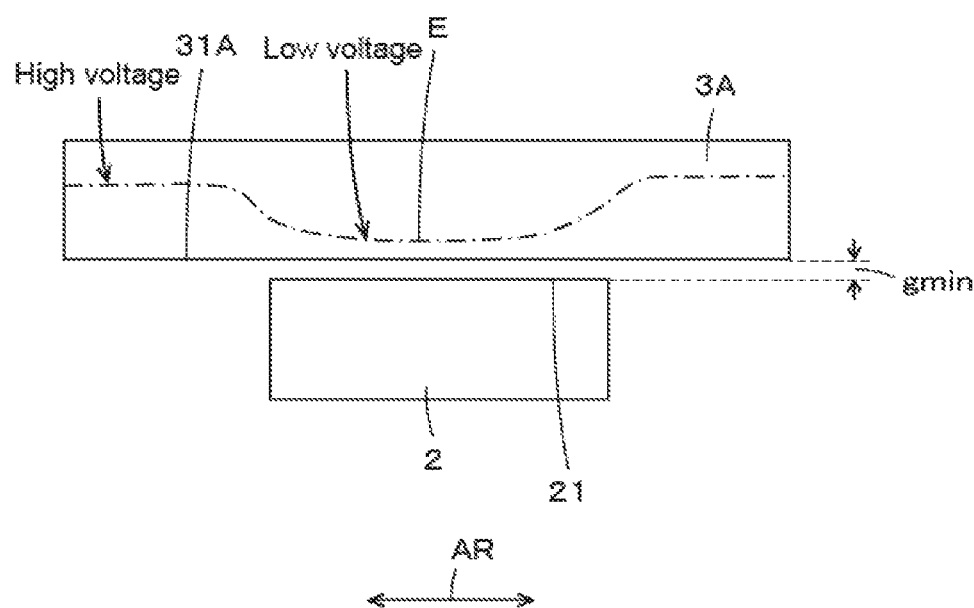
FIG. 16 is an explanation view showing a main part of the fourth configuration of our vibrational energy harvester device.

FIG. 16 explains an example of a main part of the fourth configuration of vibrational energy harvester device with opposing surfaces of movable part 2 and fixed part 3A in the above-described configuration. In the fourth configuration shown in FIG. 16, movable part 2 has a length shorter than that of fixed part 3A along the vibration direction. In this example, electret film is formed on fixed part 3A while electret electric potential E is changed along the vibration direction of movable part 2 as shown in FIG. 16 with a dashed-dotted line.

Namely, when movable part 2 remains still, electret electric potential E is set at a low level in the center of fixed part 3A opposed to movable part 2. On the other hand, electret electric potential E is set at a high level in parts to be opposed to movable part 2 when it vibrates greatly.

In the example shown in FIG. 16, projections 23,32A are formed neither on opposing surface 21 of movable part 2 nor opposing surface 31A of fixed part 3A while a gap such as gap gmin is formed between opposing surface 21 of movable part 2 and opposing surface 31a of fixed part 3A.

The relation between movable part 2 and fixed part 3B should be configured similarly to the relation between movable part 2 and fixed part 3A described above.

In the fourth configuration of vibrational energy harvester device, electret electric potential E of fixed parts 3A,3B opposed to movable part 2 having a small vibration amplitude is at a low level, so that force factor (electromechanical conversion factor) A decreases according to Formula 2 to increase output impedance. On the other hand, electret electric potential E of fixed parts 3A,3B opposed to movable part 2 having a great vibration amplitude is at a high level, so that force factor (electromechanical conversion factor) A increases according to Formula 2 to decrease output impedance.

Accordingly, output electricity can be rectified and charged efficiently regardless of low or high acceleration in the third configuration of vibrational energy harvester device, as well as the first configuration of vibrational energy harvester device 10.

In the example shown in FIG. 16, projections 23,32A are formed neither on opposing surface 21 of movable part 2 nor on opposing surface 31A of fixed part 3A, while a fixed gap is formed between opposing surface 21 of movable part 2 and opposing surface 31a of fixed part 3A, although opposing surface 21 of movable part 2 and opposing surface 31A of fixed part 3A may be configured similarly to the first configuration or a modified example thereof, or the third configuration. Of course the fourth configuration can be applied to the second configuration described above.

Other Configuration or Modified Example

Our vibrational energy harvester device is not limited to a MEMS device although the above-described configuration of vibrational energy harvester device is a MEMS device formed by performing a semiconductor process.

The shapes of projections (salients) are not limited specifically although the projections (salients) have a rectangular cross section of the movable part and fixed parts in the above-described first configuration.

Figure 17:
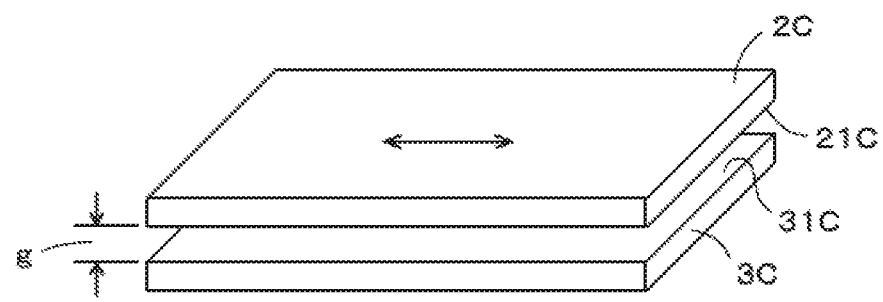
FIG. 17 is an explanation view showing a main part of another configuration of our vibrational energy harvester device.

It is possible to provide the movable part and the fixed part above and below a gap g (changeable according to the vibration of movable part) when viewed along the gravitational direction as shown in FIG. 17, although the fixed parts are provided at the sides of left and right from the movable part in the above-described configuration. Movable part 2C is at the top side while fixed part 3C is at the bottom side in the example shown in FIG. 17. Opposing surface 21C of movable part 2C opposed to fixed part 3C as well as opposing surface 31C of fixed part 3C opposed to movable part 2C are formed in the same manner as the first configuration or its modified example, or the first or fourth configuration.

Figure 18:
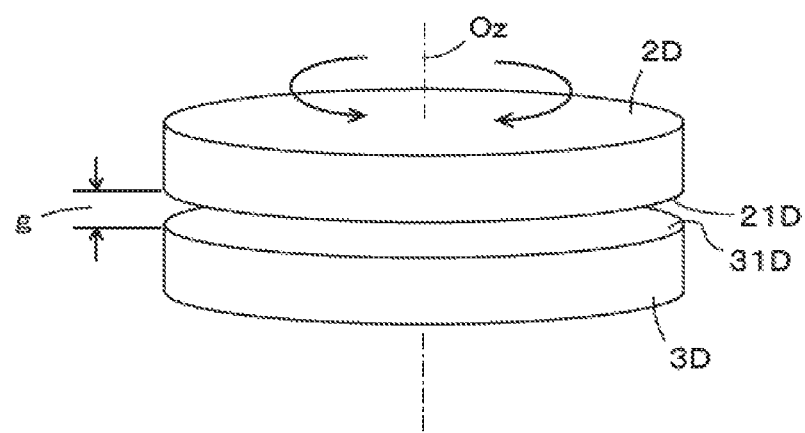
FIG. 18 is an explanation view showing a main part of yet another configuration of our vibrational energy harvester device.

The movable part may vibrate in a rotary direction instead of linear direction. FIG. 18 shows such configured example of vibrational energy harvester device provided with movable part 2D and fixed part 3D. In FIG. 18, movable part 2D and fixed part 3D are formed in disks disposed through a gap g (changeable according to the vibration of movable part). Movable part 2D is capable of rotating as shown with arrow in FIG. 18 around rotation center axis Oz (center position of disk) as keeping a gap to fixed part 3D.

In the example shown in FIG. 18, opposing surface 21D of movable part 2D opposed to fixed part 3D as well as opposing surface 31D of fixed part 3D opposed to movable part 2D are formed in the same manner as the first configuration or its modified example, or the first or fourth configuration. Besides heights of projections and electret electric potential E change in the rotation direction which corresponds to the vibration direction differently from the configuration described above.

EXPLANATION OF SYMBOLS 1, 1M: semiconductor substrate
2, 2M: movable part
3A, 3B, 3AM, 3BM: fixed part
4L, 4R, 4LM, 4RM: support beam
7: weight
21, 22: opposing surface of movable part 2
23, 24: projection of movable part 2
31A, 31B: opposing surface of fixed parts 3A,3B
32A, 32B: projection of fixed parts 3A,3B

The invention claimed is:

1. A vibrational energy harvester device capable of vibrating in a vibration direction by an externally supplied vibrational energy, comprising:
    a movable part having a first surface along the vibration direction; and
    a fixed part which has a second surface opposed through a gap to the first surface and is positionally fixed to allow the movable part to vibrate in the vibration direction, wherein
    the first surface of the movable part and the second surface of the fixed part are provided with a plurality of recessed portions and salients which are disposed alternately in the vibration direction,
    an electret film is formed on at least one of the fixed part and the movable part, and
    a force factor as an electromechanical conversion factor having a value corresponding to the gap between the first surface of the movable part and the second surface of the fixed part increases when a vibration amplitude of the movable part increases, wherein
    the salients of the first surface of the movable part and the salients of the second surface of the fixed part are disposed by an array pitch in the vibration direction, and
    a height of the salients disposed in the vibration direction measured along a direction orthogonal to the vibration direction gradually increases and then gradually decreases along the vibration direction.

2. The vibrational energy harvester device according to claim 1, wherein
    a minimum value of the gap between the salients of the first surface of the movable part and the salients of the second surface of the fixed part is greater when the vibration amplitude of the movable part is smaller, and
    the minimum value of the gap between the salients of the first surface of the movable part and the salients of the second surface of the fixed part is smaller when the vibration amplitude of the movable part is greater.

3. The vibrational energy harvester device according to claim 1, wherein the salients having lower heights along the direction orthogonal to the vibration direction have narrower widths along the vibration direction.

4. The vibrational energy harvester device according to claim 1, wherein a density of the salients in the vibration direction varies.

5. The vibrational energy harvester device according to claim 1, wherein the salients comprise a plurality of projections which project in a direction orthogonal to the vibration direction and are disposed to form a shape like comb teeth in the vibration direction.

6. The vibrational energy harvester device according to claim 1, wherein the salients comprise a plurality of wedges disposed in the vibration direction.

7. The vibrational energy harvester device according to claim 1, wherein the first surface of the movable part and the second surface of the fixed part have waveforms formed with the recessed portions and the salients.

8. The vibrational energy harvester device according to claim 1, wherein the fixed part and the movable part are MEMS devices formed from a semiconductor substrate.

9. The vibrational energy harvester device according to claim 8, wherein the first surface of the movable part and the second surface of the fixed part are orthogonal to a substrate surface of the semiconductor substrate, both ends of the movable part in the vibration direction being supported by support beams formed from the semiconductor substrate to allow the movable part to vibrationally shift in the vibration direction.

10. The vibrational energy harvester device according to claim 1, wherein the movable part and the fixed part comprise flat plate members.

11. The vibrational energy harvester device according to claim 1, wherein the movable part vibrationally rotates around a rotation axis orthogonal to the first surface.

12. The vibrational energy harvester device according to claim 1, wherein the movable part has a plurality of the first surfaces along the vibration direction while the fixed part has a plurality of the second surfaces opposed to the first surfaces of the movable part.

13. The vibrational energy harvester device according to claim 1, wherein a weight is provided on the movable part.

14. The vibrational energy harvester device according to claim 1, comprising a plurality of the movable parts in a direction orthogonal to the vibration direction, wherein the fixed part has a plurality of the second surfaces opposed to the first surfaces of the movable parts.

15. A vibrational energy harvester device capable of vibrating in a vibration direction by an externally supplied vibrational energy, comprising:
    a movable part having a first surface along the vibration direction; and
    a fixed part which has a second surface opposed through a gap to the first surface and is positionally fixed to allow the movable part to vibrate in the vibration direction, wherein the first surface of the movable part and the second surface of the fixed part are provided with a plurality of recessed portions and salients which are disposed alternately in the vibration direction, an electret film is formed on at least one of the fixed part and the movable part, a force factor as an electromechanical conversion factor having a value corresponding to the gap between the first surface of the movable part and the second surface of the fixed part increases when a vibration amplitude of the movable part increases, the recessed portions and the salients formed on the first surface of the movable part and the second surface of the fixed part are grouped into a first group and a second group which have array pitch phases different to each other in the vibration direction, and the second group comprises the salients which are not overlapped in a direction orthogonal to the vibration direction between the movable part and the fixed part, when the first group comprises the salients which are overlapped in a direction orthogonal to the vibration direction and are opposed to each other between the movable part and the fixed part.

* * * * *